US006727106B1

(12) United States Patent
Ankutse et al.

(10) Patent No.: US 6,727,106 B1
(45) Date of Patent: Apr. 27, 2004

(54) SYSTEM AND SOFTWARE FOR STATISTICAL PROCESS CONTROL IN SEMICONDUCTOR MANUFACTURING AND METHOD THEREOF

(75) Inventors: Emmanuel Kwaku Foli Ankutse, Round Rock, TX (US); Russell Clinton Brown, Austin, TX (US); Konstantinos Kyriakopoulos, Austin, TX (US); Yurong Shi, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 163 days.

(21) Appl. No.: 09/905,222

(22) Filed: Jul. 12, 2001

(51) Int. Cl.[7] .............................................. H01L 21/00
(52) U.S. Cl. ......................................................... 438/5
(58) Field of Search ................ 438/14, 52, 8, 438/5; 257/773; 324/158.1

(56) References Cited

U.S. PATENT DOCUMENTS

| | | |
|---|---|---|
| 4,590,550 A | 5/1986 | Eilert et al. |
| 4,967,381 A | 10/1990 | Lane et al. |
| 5,196,997 A | 3/1993 | Kurtzberg et al. |
| 5,586,041 A | 12/1996 | Mangrulkar |
| 5,646,870 A | 7/1997 | Krivokapic et al. |
| 5,654,903 A | 8/1997 | Reitman et al. |
| 5,715,181 A | 2/1998 | Horst |
| 5,719,495 A * | 2/1998 | Moslehi .................... 324/158.1 |
| 5,761,064 A | 6/1998 | La et al. |
| 5,790,977 A | 8/1998 | Ezekiel |
| 5,841,676 A | 11/1998 | Ali et al. |
| 5,883,437 A * | 3/1999 | Maruyama .................. 257/773 |
| 5,930,138 A | 7/1999 | Lin et al. |
| 5,964,643 A | 10/1999 | Birang et al. |
| 5,978,071 A | 11/1999 | Miyajima et al. |
| 5,991,699 A | 11/1999 | Kulkarni et al. |
| 5,995,912 A | 11/1999 | DeWolf et al. |
| 6,027,842 A | 2/2000 | Ausschnitt et al. |
| 6,055,463 A | 4/2000 | Cheong et al. |
| 6,163,801 A | 12/2000 | O'Donnell et al. |
| 6,240,329 B1 | 5/2001 | Sun |
| 6,303,395 B1 * | 10/2001 | Nulman ........................ 438/52 |
| 6,370,448 B1 | 4/2002 | Eryurek |
| 6,370,487 B1 | 4/2002 | Dorough |
| 6,424,876 B1 | 7/2002 | Cusson et al. |
| 6,445,969 B1 | 9/2002 | Kenney et al. |
| 6,470,227 B1 | 10/2002 | Rangachari et al. |
| 6,487,472 B1 | 11/2002 | Song et al. |
| 6,499,007 B1 | 12/2002 | Kuroki et al. |
| 6,528,219 B1 | 3/2003 | Conrad et al. |
| 6,532,427 B1 | 3/2003 | Joshi et al. |

OTHER PUBLICATIONS

SECSHost: Expand Your View with SECS Communications, Oct. 20, 1999.
SPC: Expand Your View with Statistical Process Control, Mar. 15, 2000.
RSView32: Technical Data, May 15, 2000.
RSView Machine Edition: Technical Data, Nov. 2000.

* cited by examiner

*Primary Examiner*—John F. Niebling
*Assistant Examiner*—Andre' C Stevenson
(74) *Attorney, Agent, or Firm*—Toler, Larson & Abel, LLP

(57) ABSTRACT

The statistical process control (SPC) subsystem is the heart of the data collection and process control system for semiconductor manufacturing in the various embodiments as disclosed herein. SPC is responsible for performing calculations to generate statistics on collected measurement data, applying rules to the statistics, and executing error actions when those rules are violated. SPC subsystem plays a role in corrective actions as well by lifting restrictions previously imposed on tools or lots as a result of rule violations. In an embodiment, SPC is supported through underlying transaction and performance monitoring system components. In an embodiment, SPC procedure is a statistical engine that performs what the process control strategy (PCS) describes, hence there is at least one SPC procedure for each PCS. Components in SPC send data to the chart client subsystem as embodied herein, which allows visualization of statistics generated by SPC procedure in graphical chart form via a web browser. SPC communicates with MES via an interface.

20 Claims, 22 Drawing Sheets

SYSTEM AND SOFTWARE FOR STATISTICAL PROCESS CONTROL IN SEMICONDUCTOR MANUFACTURING AND METHOD THEREOF

CO-PENDING APPLICATIONS

This application is related to U.S. patent application Ser. No.09/905,226, entitled "System and Software for Data Distribution in Semiconductor Manufacturing and Method Thereof," U.S. patent application Ser. No. 09/905,220 entitled "System and Software for Data Collection and Process Control in Semiconductor Manufacturing and Method Thereof, "U.S. patent application Ser. No. 09/905,213 entitled "System and Software for Database Structure in Semiconductor Manufacturing and Method Thereof," U.S. patent application Ser. No. 09/904,619, entitled "System and Software for Process Control with Fabrication Operator Interface and Method Thereof," U.S. patent application Ser. No. 09/904,953 entitled "System and Software for Data History Reconstruction in Semiconductor Manufacturing and Method Thereof," U.S. patent application Ser. No. 09/905,214, entitled "System and Software for Normalization and Denormalization of Data in Semiconductor Manufacturing and Method Thereof," U.S. patent application Ser. No. 09/905,214, entitled "Process Control Interface in Semiconductor Manufacturing and Method Thereof," all filed of even date herewith.

FIELD OF THE DISCLOSURE

The present disclosure relates generally to process control, and more particularly to data collection and process control in the semiconductor manufacturing industry.

BACKGROUND

Current commercially available manufacturing execution system (MES) packages are used throughout the semiconductor manufacturing sector. These systems track each wafer and determine where it has been and where the wafer needs to go. However, the model of statistical process control (SPC) employed by most commercially available packages is a naïve model with assumptions built into the system that are incorrect, i.e., one parameter is measured, at one place, using only one type of product, only once. For example, most SPC systems are entity- and lot-based, but the real world of the factory is chamber- and wafer-based. From an automation user's point of view, these SPC systems are difficult for programmers to maintain and enhance. Also, at least in part because of the assumptions, these SPC systems require many statistical process control charts (over 14,000 for a typical fab operation) for effective process monitoring. Maintaining so many charts is costly, hinders change, and can obscure important statistics. In addition, due to the monolithic nature of charting systems used with current semiconductor SPC systems, producing a statistical process control chart for viewing is typically a labor-intensive process.

Individual point solutions offered by various vendors for particular applications do not adequately address the shortcomings of currently available systems, because point solutions do not take into account the many different databases and manufacturing models, with their attendant integration problems. Hence, the use of many independent point solutions may generate communications barriers caused by multiple point solutions not being easily integratable within the larger whole of an MES system.

Accordingly, a need exists for a solution to the problems currently encountered with the statistical process control and disparate database collection aspects of manufacturing execution systems in semiconductor manufacturing facilities.

DETAILED DESCRIPTION OF THE FIGURES

Figure 1:
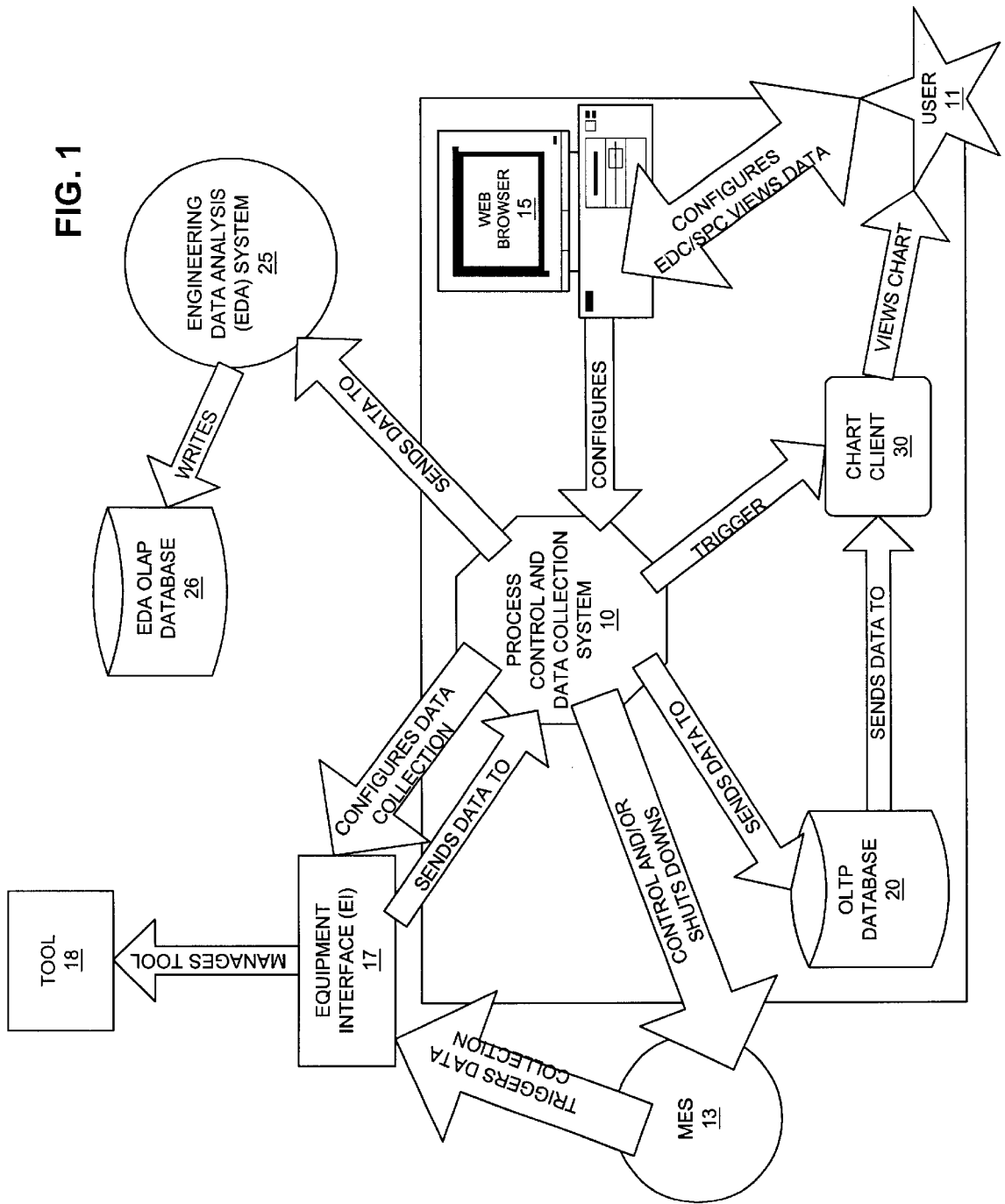
FIG. 1 is an overview diagram illustrating the interrelationships of various system components of an integrated system according to at least one embodiment of the present disclosure.

The statistical process control (SPC) subsystem is the central sub system of the data collection and process control system for semiconductor manufacturing in the various embodiments as disclosed herein. The SPC subsystem is responsible for performing calculations to generate statistics on collected measurement data, applying rules to the statistics, and executing error actions when those rules are violated. In at least one embodiment, the SPC subsystem performs background calculations in real time to facilitate "on-line" processing that might otherwise have to be performed "off-line."

The SPC subsystem plays a role in corrective actions as well, by lifting restrictions previously imposed on tools or lots as a result of rule violations. In one embodiment, SPC is supported through underlying transaction and performance monitoring system components. An SPC procedure is a statistical engine that performs what the process control strategy (PCS) describes, hence there is one SPC procedure for each PCS. Components in SPC send data to the chart client subsystem as embodied herein, which allows visualization of statistics generated by SPC procedure in graphical chart form via a web browser or other suitable network interface.

In at least one embodiment as disclosed herein, the SPC subsystem allows users to perform online, functions that were previously only feasible using offline systems.

FIGS. 1 through 20 illustrate an engineering data collection and process control system for use in a semiconductor manufacturing environment. The method, system, and software disclosed herein can be used to improve quality management objectives in areas such as data collection, data analysis, statistical process control, and corrective action plans, as well as other quality issues encountered in semiconductor manufacturing environments.

In an embodiment of the present disclosure, measurement data is taken in from fabrication process tools and metrology tools, where it may then be characterized as to quality of product resulting from the various manufacturing processes. For example, in its various embodiments, the method collects data from process and metrology tools, generates statistics from that data, detects tool failures, processing errors, and other conditions that can jeopardize product output, and performs high level process control in the form of tool shutdowns, lot holds, and lot releases. One method as disclosed automates the recording of engineering data, automates configuration of data collection, and automates process equipment shut downs, all within the existing framework of existing MES systems, and engineering data collection systems in a semiconductor manufacturing environment. An embodiment supports wafer- and chamber-level tracking, thus reducing the time required to detect tool failures or faulty configurations, as well as making it possible to increase the accurate diagnosis of tool failures or faulty configurations. In another embodiment, the method facilitates control of chamber-to-chamber variations, and enables shutdown of single chambers on cluster tools. Measurement data may be stored in fullest detail, and may be summarized upon extraction from the database rather than prior to storage, as is the case with many current systems. Additionally, engineering data is provided to an engineering data analysis (EDA) database as it is collected.

The method facilitates decision support by allowing real-time monitoring of equipment performance during the various stages of a fabrication cycle by providing a chart client to allow, via graphical user interface, display of up to four charts per screen preview area, in a "web browser" (i.e., HTTP client program) window, via an Internet interface. In one embodiment, the chart may also be accessible without a web browser. Charts created with the method as disclosed permit users to chart by semiconductor processing tool, metrology tool, or by a chamber within a semiconductor processing tool. By means of the chart client as embodied by the method herein, users may view, modify, and perform "what if" analyses on statistical process control (SPC) charts, both from within a fabrication facility, or outside of a fabrication facility, on a PC or Unix workstation. In addition, a "history reconstruction" feature allows detailed trend analyses, as well as a being a key enabler for performing "what-if" analyses.

In one embodiment, the engineering data collection and process control system disclosed herein integrates seamlessly with existing MES, engineering data collection systems, and equipment interfaces (EIs). This integration may be fully appreciated by referring to FIG. 1, which is an overview diagram illustrating the functionality of systems integration in a semiconductor manufacturing environment under an embodiment of the present disclosure. With the embodied process control system 10, a user 11 is able to configure engineering data collection (EDC) from process and metrology tools, specify the data that is used for statistical process control (SPC), and define how the SPC data is to be processed and interpreted. In at least one embodiment, all of this is done via an Internet interface, such as web browser 15. In another embodiment, web browser 15 may interface with a network other than the Internet. Web browser 15 sends the EDC/SPC configuration data to the process control system 10, which, through various subsystems to be discussed in greater detail in the figures that follow, ensures that the appropriate action takes place to implement the desired EDC/SPC configuration in the manufacturing cycle. For example, the manufacturing execution system (MES) begins its function in the fabrication cycle by sending a trigger to the equipment interface (EI) 17, which manages tool 18. Tool 18 may be either a process or a metrology tool used in a semiconductor manufacturing environment. The equipment interface 17 requests and receives EDC configuration data from process control system 10, and, in turn, sends the measurement data and other process data that the EI 17 collects from the tool 18 to process control system 10. The tool measurement and other data sent from the EI 17 to the process control system 10 is then sent by the process control system 10 to an OLTP (online transaction processing) database 20, and an engineering data analysis system 25 and its online analytical processing (OLAP) database 26. The measurement data may also be distributed to various internal subscribers, such as an SPC subsystem (not illustrated). In the fabrication cycle, MES 13, through process control system 10, triggers the chart client 30 whenever a course of action involving process control occurs, in which case a relevant chart can be automatically displayed. The embodied process control system 10, through chart client 30, will thus automatically display SPC data as it is collected. This real-time data collection and analysis capability allows user 11 to specify high-level process control actions, such as tool shutdowns and lot holds, at any point in the manufacturing cycle. The area shaded in light grey in FIG. 1 indicates the various systems and subsystems within process control system 10, whose integration/interactions with existing MES and EDA systems facilitate this real-time decision support capability.

Figure 2:
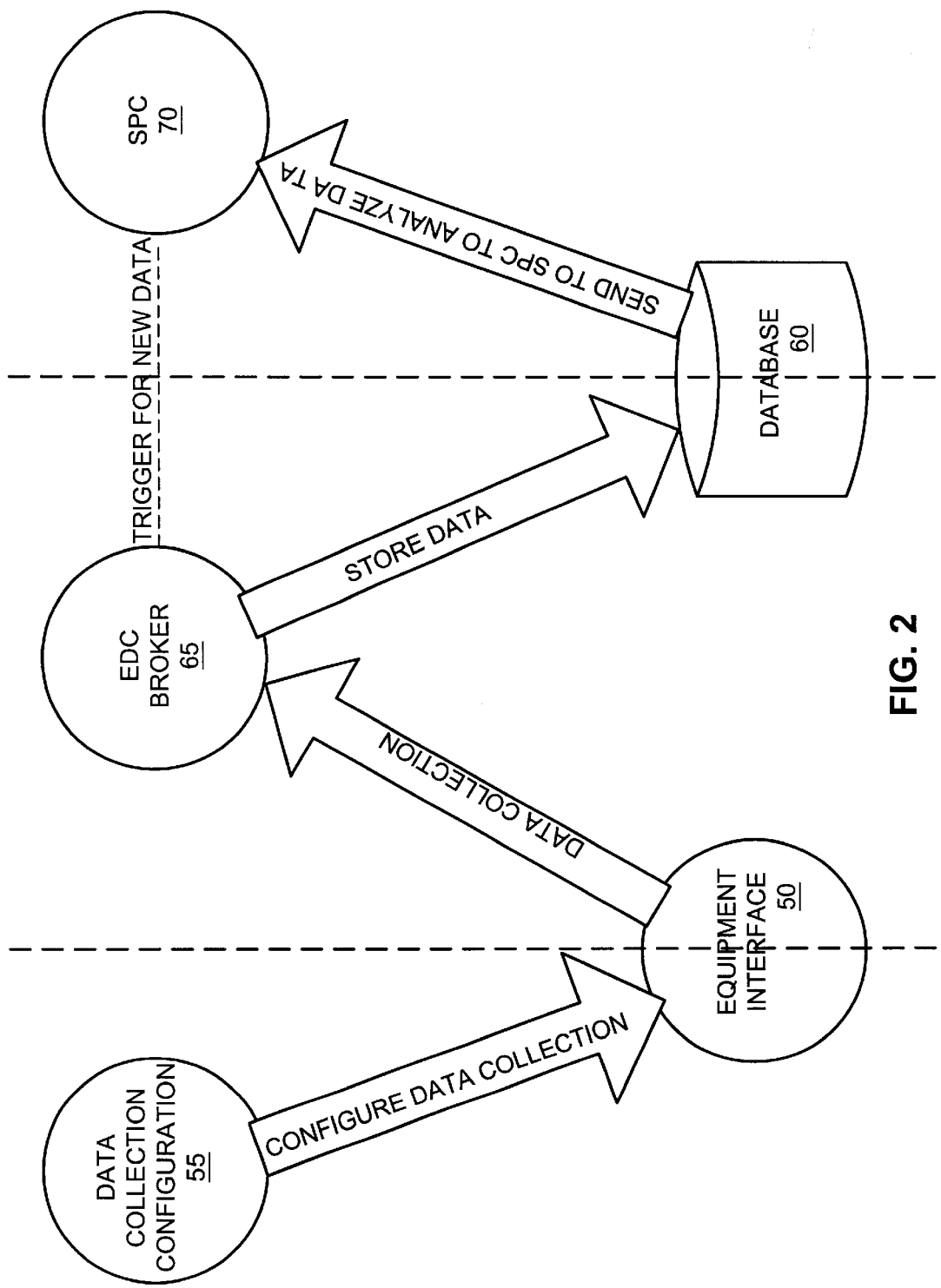
FIG. 2. is a drawing illustrating the modular nature of a system according to at least one embodiment of the present disclosure.

Referring now to FIG. 2, the modular architecture of the various systems' components according to an embodiment of the present disclosure will be discussed. Each of the respective systems are independent, yet together function as an integral part of a whole. The dotted lines passing through equipment interface 50 and transaction processing database 60 demarcate these integrated but separate systems, or "islands of automation" within the process control system as disclosed herein. Those functions handled by the data collection configuration component 55 are independent of the engineering data control (EDC) broker component 65. The EDC broker 65 is independent of the statistical process control (SPC) component 70. Thus, the method as embodied by the present disclosure offers the advantages of the self-sufficiency of point solutions, yet is easily integratable within a larger suite of applications and systems, thereby offering greater flexibility.

Figure 3:
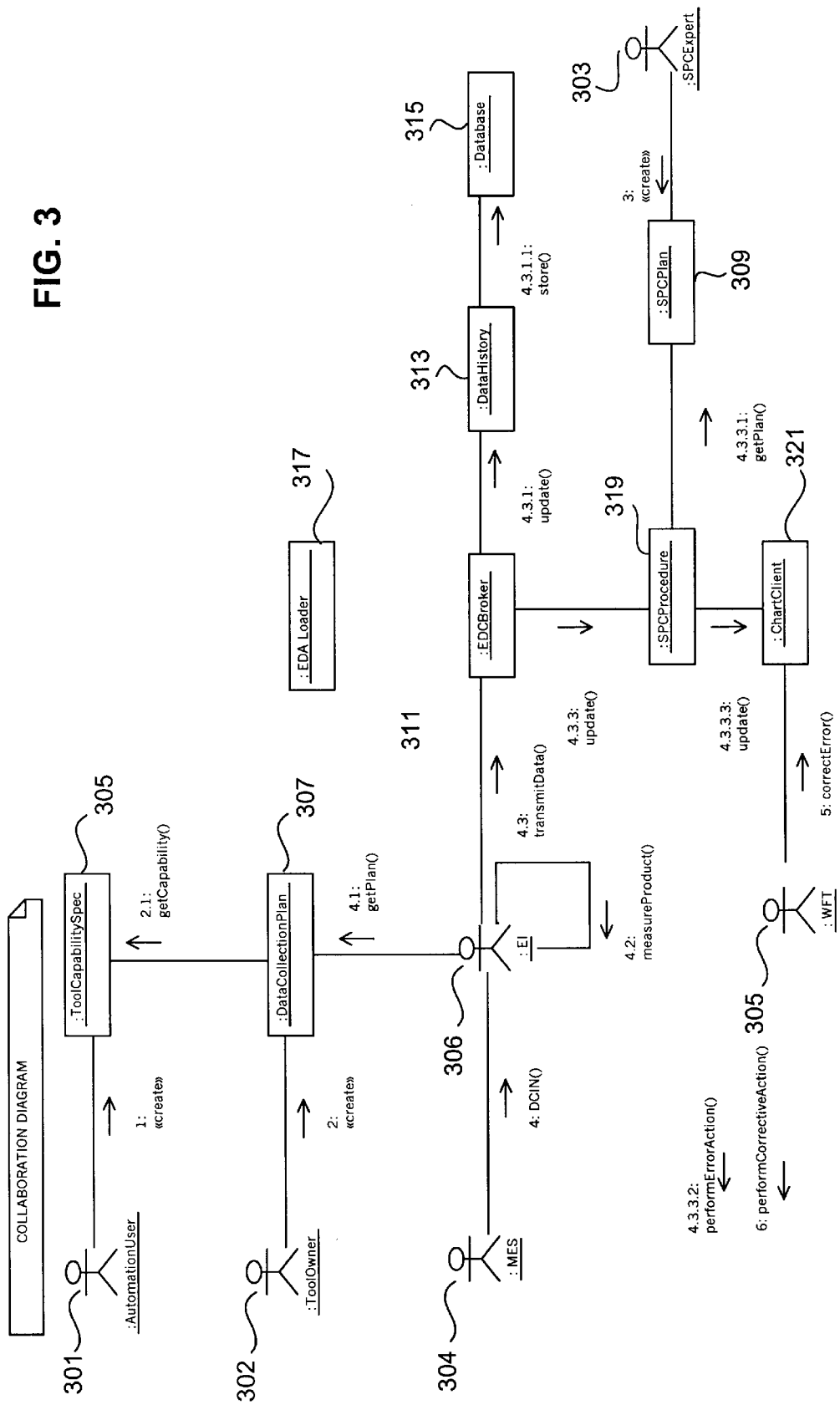
FIG. 3 is a highly simplified UML collaboration diagram illustrating the highest-level activities that are performed in the process control system according to at least one embodiment of the present disclosure.

Referring now to FIG. 3, which shows a simplified Unified Modeling Language (UML) collaboration diagram illustrating the highest-level activities that are performed in the process control system according to at least one embodiment of the present disclosure. Unified Modeling Language (ITML) is the industry-standard, general-purpose notational language for specifying, visualizing, constructing, and documenting complex software systems, particularly large object oriented projects, as well as for business modeling, and other non-software systems. In FIG. 3, some liberties have been taken in the order of processing, and internal components such as managers have been omitted. With UML, conventions are used to describe concepts, flows, and interactions. In a use-case or interaction sense, in UML, a "stick man" figure denotes an actor name or actor class (actor name:Actor class), i.e., the systems or users which interact within the system encompassed by the UML diagram. Hence there are six actor classes shown in FIG. 3: :AutomationUser 301, :ToolOwner 302, :SPCExpert 303, MES system 304, :WFT (wafer fabrication technician) 305, and :EI (equipment interface) 306.

The flow directional arrows going from each of the actors (301–306) has a numerical sequence and notation written under the directional arrow. The number indicates the order of the sequence within the system, and incrementing a number decimally indicates the "order" in a flow with multiple steps, thus 4 occurs first, 4.1 second, 4.2 third, 4.3 fourth, 4.3.1 fifth, 4.3.1.1 sixth, and so on. The notation after a number under the directional arrows indicates the event or operation initiated or conducted by the respective actor class, and the rectangular box indicates the package name or object class name upon which the actors "act." Thus, AutomationUser 301 1:"create" indicates that AutomationUser 301 would create the object named ToolCapabilitySpec 305. The second action (2) is creation of the DataCollectionPlan 307 by ToolOwner 302. A third (3) action is creation of SPCPlan 309 by SPCExpert 303. Then MES 304 sends DCIN message (4) to :EI 306, which gets (4.1) DataCollectionPlan 307, measures the product (4.2), transmits the data (4.3) to the EDCBroker 311. EDCBroker 311 updates (4.3.1) DataHistory 313, which is stored (4.3.1.1) by Database 315. Another action taken by EDCBroker 311 is to update data (4.3.2) to the engineering data analysis interface, :EDALoader 317, followed by updates (4.3.3) to the SPCProcedure. Then SPCProcedure 319 gets (4.3.3.1) SPCPlan 309. Should an out of control condition exist requiring a tool shutdown, SPCProcedure 319 sends a perform error action (4.3.3.2) to MES 304. SPCProcedure 319 also updates (4.3.3.3) the data to the ChartClient 321. WFT 305 views the chart and sends a. correctError message (5) to Chart Client 321, which, in turn, sends a perormCorrectiveAction (6) message to MES 304.

A representative operation of the semiconductor manufacturing process control system as embodied herein receives measurement data at a statistical process control (SPC) system from an engineering data analysis data broker during a semiconductor manufacturing process; the SPC evaluates the data in accordance with a process control strategy (PCS), and implements appropriate control actions based upon the data evaluation.

Figure 4A:
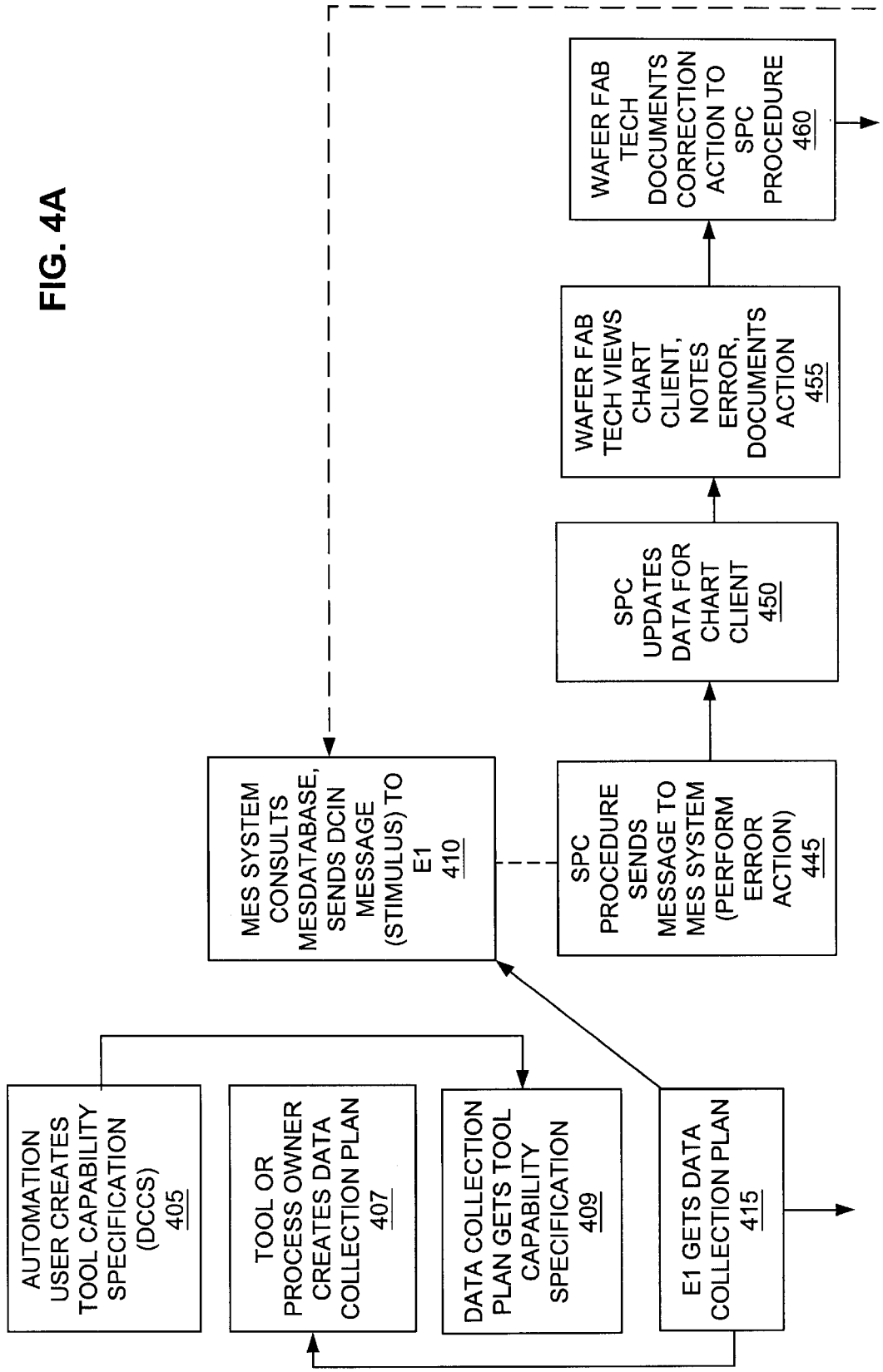
FIG. 4 is a flow diagram illustrating a typical operation of a process control system according to at least one embodiment of the present disclosure.
Figure 4B:
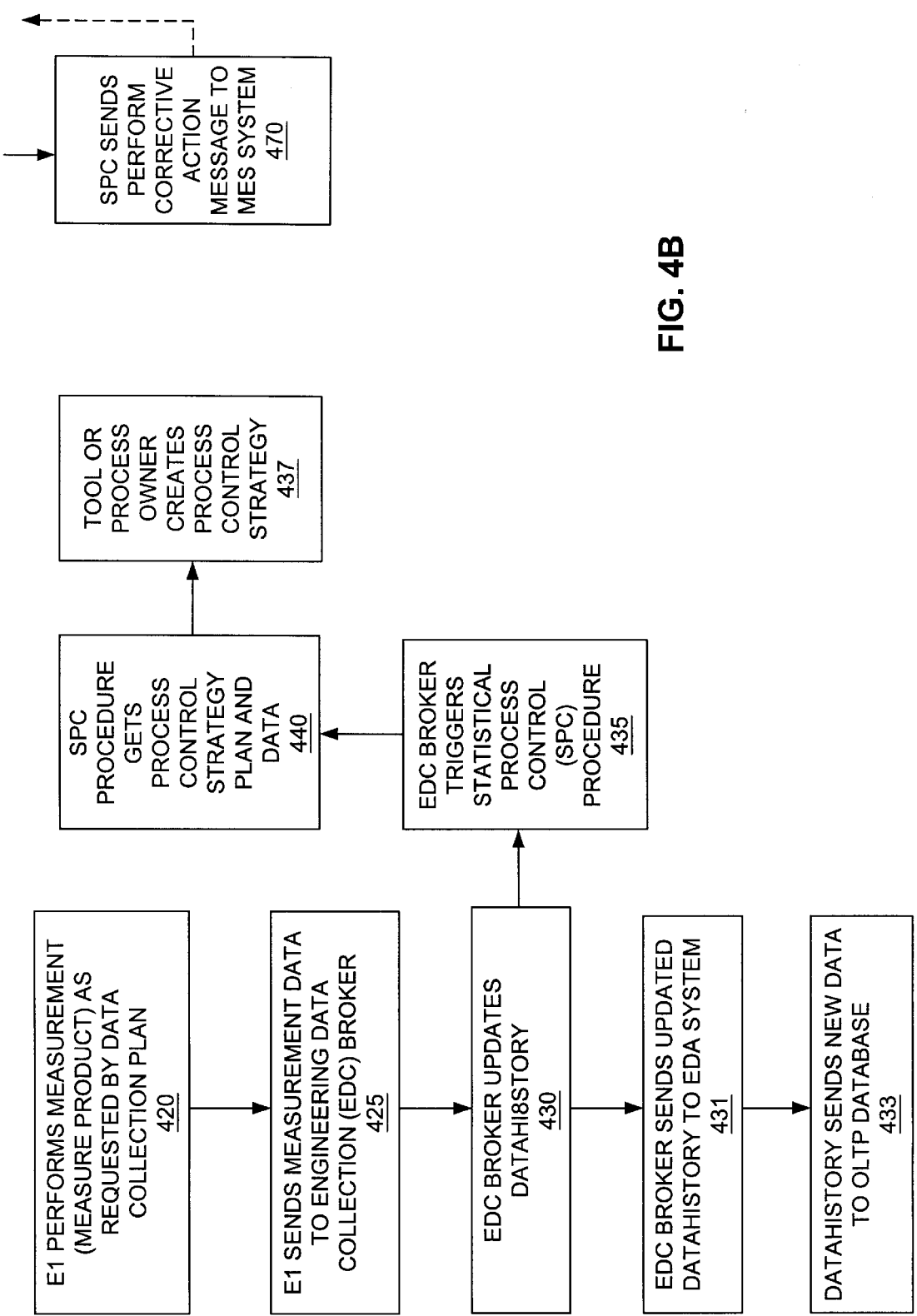

An example representing typical operations of the process control system is presented in FIG. 4, which is a flow diagram of a typical operation of the process control system according to at least one embodiment of the present invention. It should be noted that although the steps in FIG. 4 are described in a sequential order for purposes of illustration, some steps may be performed simultaneously with other steps, or some steps may be performed in a different order than shown in FIG. 4. In step 405, an automation user creates a tool capability specification, known as a data collection capability specification (DCCS). In at least one embodiment, a DCCS is a versioned document that defines the data collection capabilities of a tool (i.e., contexts, events, and parameters). For any given tool, a data collection capability specification (DCCS) version is created before a data collection plan (DCP) is implemented. In step 407, a tool or process owner creates a data collection plan (DCP), which, in one embodiment, is a versioned document that defines the parameters that a tool should collect at a particular context. In step 409, the data collection plan gets the tool capability specification or DCCS. Hence a graphical user interface is used to receive for analysis a first selection indicating a set of statistical process control data associated with a semiconductor process; a second selection indicating what processing is to be performed on the set is received, and a statistical process subsystem processes the statistical process control data in accordance with the processing indicated by the second selection. A data collection plan (DCP) is associated with a DCCS and is attached to at least one MES context. An MES context is the means by which DCPs are selected for engineering data collection. If a DCP is not attached to a context, it will not be used.

In step 410, the MES system consults the MES system database, and sends a DCIN message (stimulus) to the equipment interface (EI). In step 415, the equipment interface (EI) gets the data collection plan. In step 420, the EI performs measurements (i.e., measureproduct), as requested by the data collection plan (DCP). In step 425, the EI sends the measurement data to the engineering data collection (EDC) broker. In step 430, the EDC broker updates DataHistory. In step 431, the EDC broker sends updated DataHistory to the engineering data analysis (EDA) system, e.g., SAPPHiRE. In step 433 DataHistory subscriber sends new data to the OLTP database (transaction and performance monitoring system database) for storage. In step 435, the EDC broker triggers the statistical process control (SPC) procedure. In step 440, SPC procedure gets the process control strategy (PCS) plan and data. The process control strategy was created by a tool or process owner in step 437. The nature of the system framework in the method as embodied by the present disclosure is such that the measurement data received from fabrication process tools and metrology tools is received as the measurements occur, and statistical process analysis generates statistics from that data online, effectively in real-time. Real-time as used herein implies both that analytical data may be displayed within seconds of its creation during a fabrication cycle, as well as there being a definitive time stamp associated with each data point generated according to an embodiment of the present disclosure. This real-time analysis capability enables early detection of processing errors and other conditions that can jeopardize product output, and does it at the batch, lot, or wafer level.

In addition, an embodiment enables the performance of high-level process controls in the form of tool shutdowns (making a machine unavailable for use), lot holds, and lot releases. This high-level process control capability applies to metrology tools and semiconductor processing tools, and even to the level of an individual chamber within a semiconductor processing tool having multiple chambers, or an individual polish head, for example, in the case of a tool with multiple polish heads. This feature is seen in the latter steps of the flow chart of FIG. 4, as in step 445 where, i f an error is detected, i.e., an out of control (OOC) condition exists, SPC procedure sends a message to the MES system (performErrorAction). In step 450, statistical process control (SPC) updates data for the chart client, and the wafer fabrication technician views SPC charts with the chart client, notes the error, and documents the action in step 455. In step 460, the wafer fabrication technician documents the corrective action to the SPC procedure. In step 470, the SPC sends a perform corrective action message to MES system.

Figure 5A:
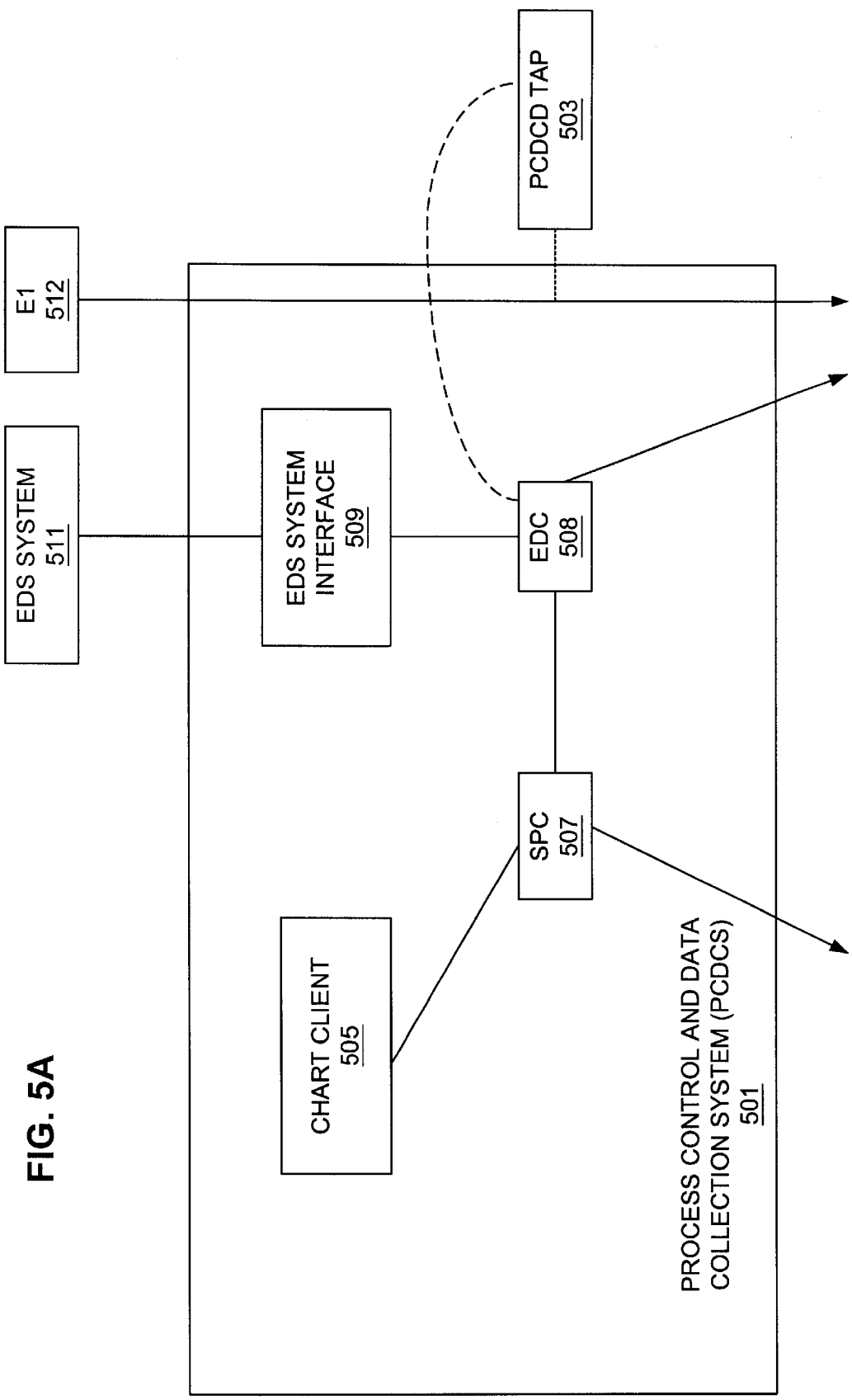
FIG. 5 is a block diagram of the major subsystems of a process control system according to at least one embodiment of the present disclosure.
Figure 5B:
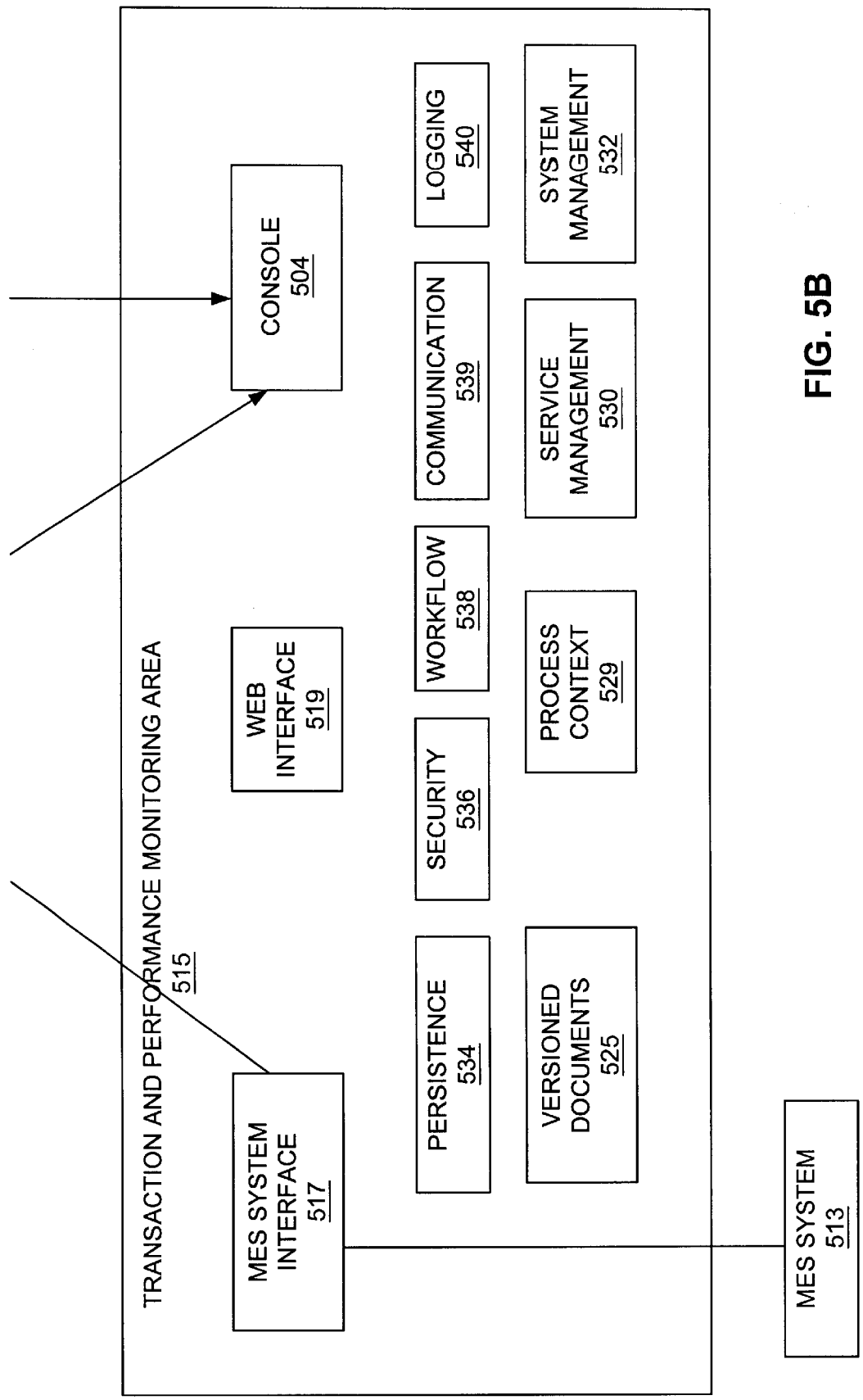

Various features and functional capabilities of the method as embodied have been presented in broad terms, hence now discussion will turn to the finer details of the various parts of the arrangement. FIG. 5 is a block diagram of the major subsystems of the data collection and process control system. The components within the data collection and process control system domain 501, indicated by the area shaded in lighter grey, includes a chart viewing client subsystem 505, statistical process control subsystem 507, the engineering data collection subsystem 508, an interface 509 to the engineering data analysis system 511, and a tap 503 which intercepts all communications between the equipment interface 512 and console 504. Console 504 serves as the interface between the engineering data collection subsystem 508 and the equipment interface 512.

The area shaded in darker grey in FIG. 5 indicates the transaction processing and performance monitoring system areas 515 which are utilized by the various subsystems in process control system 501. Transaction and performance monitoring system components may be thought of as an underlying support layer, or "glue" which consolidates and orchestrates the smooth, seamless function of data collection and process control system 501. The transaction and performance monitoring area 515 includes the interface 517 between the MES system 513 and the SPC subsystem 507. The graphical user interface (GUI)/HTTP-based web program interface 519 allows a more user-friendly graphical presentation than that of the monolithic interfaces of the past for communicating with the other applications within the data collection and process control system domain 501 and the transaction and performance monitoring system area 515. Via a common web interface 519 on console 504, for example, users can create or edit versioned documents 523 such as a data collection capability specification (DCCS) or a process control specification (PCS). It should be noted that in at least one embodiment, versioned documents 523 are not files, and are not stored as binary large objects (BLOBs). Each of the versioned documents 523 has its own tables in the transaction processing database into which it writes its attributes, which allows configuration data to be accessible to reporting tools. An assortment of other application programming interfaces exist within transaction and processing area 515, such as process context 529 which is a rule-matching algorithm used to identify a DCP attached to a context matching the applicable MES context, service management 530 which groups components together into services for reliability purposes, system management 532 which controls the configuration and startup/shutdown of the system, and persistence 534, which is responsible for storing the attributes of objects into the database. In addition, security 536 authenticates users and authorizes them to perform particular functions within the system, communication 539 is the facility that allows the transmission of information from one component to another, often over a network, logging 540 which records significant events that occur in the system for troubleshooting purposes, and workflow 538. Workflow 538 insures that a versioned document that has been submitted for approval is properly routed to obtain the appropriate approvals before changes to the system proposed by the submitted versioned document become effective.

Figure 6:
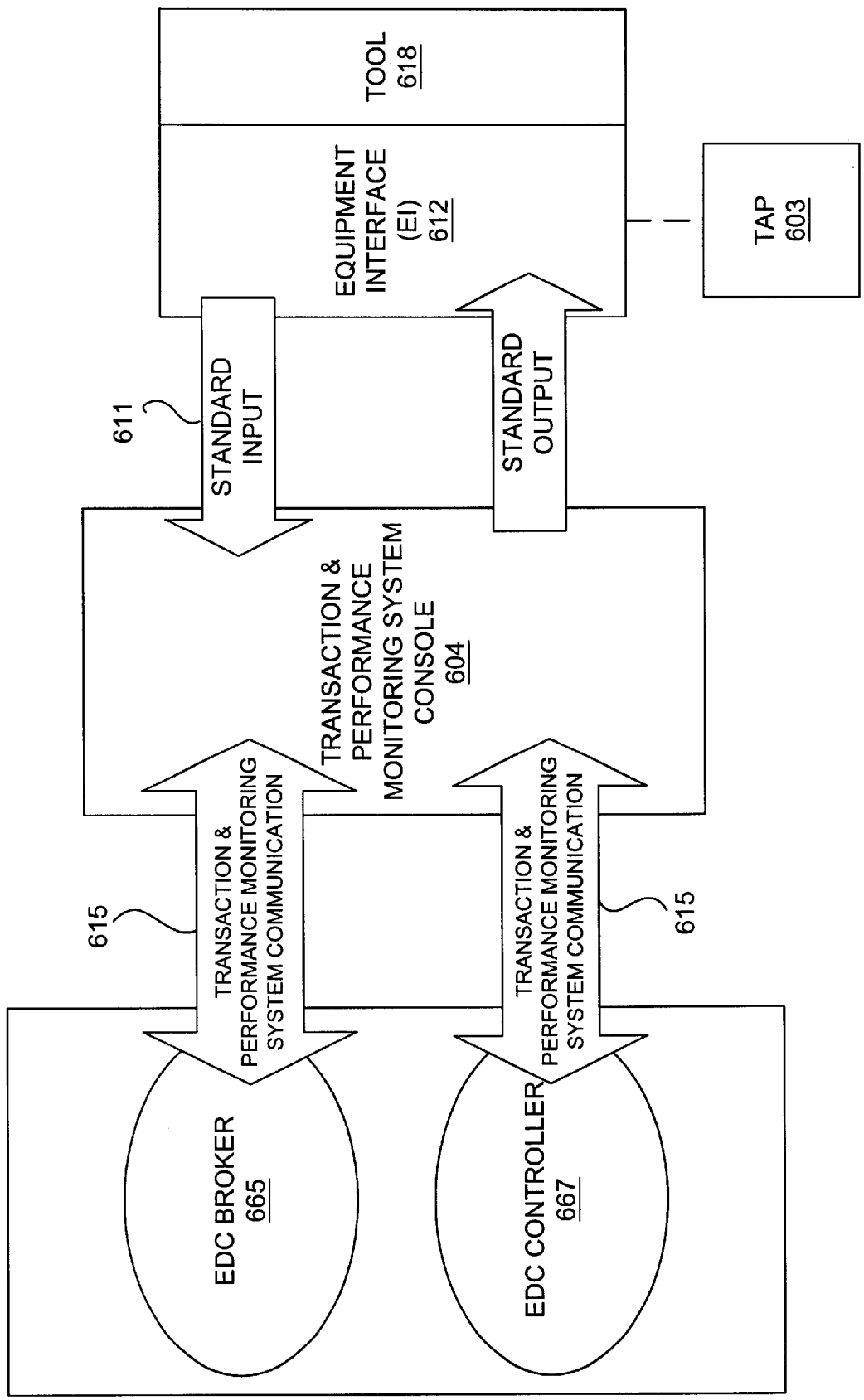
FIG. 6 is a block diagram of an equipment interface communication subsystem within a process control system according to at least one embodiment of the present disclosure.

The major subsystems within the process control system shall now be presented, beginning with FIG. 6, a block diagram of the equipment interface communication (tap) subsystem within the data collection and process control system according to an embodiment of the present disclosure. It should be noted that the chosen order of presentation of the various subsystems is not meant to imply that one particular subsystem is more "important" than another subsystem. As seen in FIG. 6, tap 603 may be thought of as a constant-monitoring type of device which intercepts all communications between equipment interface 612 and transaction and performance monitoring system console 604. Console 604 serves as the interface between the engineering data collection (EDC) subsystem 608 and the equipment interface 612. Tap 603 is responsible for getting data out of tools 618 and into the data collection and process control system (501, FIG. 5). Tap 603 queries EDC controller 667 within EDC subsystem 608 for a data collection plan (DCP), and then sets up data collection according to the instructions in the DCP. EDC broker 665 receives the data collected according to the DCP, and sends it to the various subscribers (not illustrated). In one embodiment, once data is collected, it is stored in the entity data model, which is part of a semiconductor fabrication facility's equipment interface baseline (not illustrated). The tap 603 knows how to convert the entity data model to FIDOSpeak (a simple ASC11 language) and feed it to console 604 over UNIX standard input 611. The console 604 transmits the data 615 to the EDC broker 665 within the EDC subsystem 608.

Figure 7:
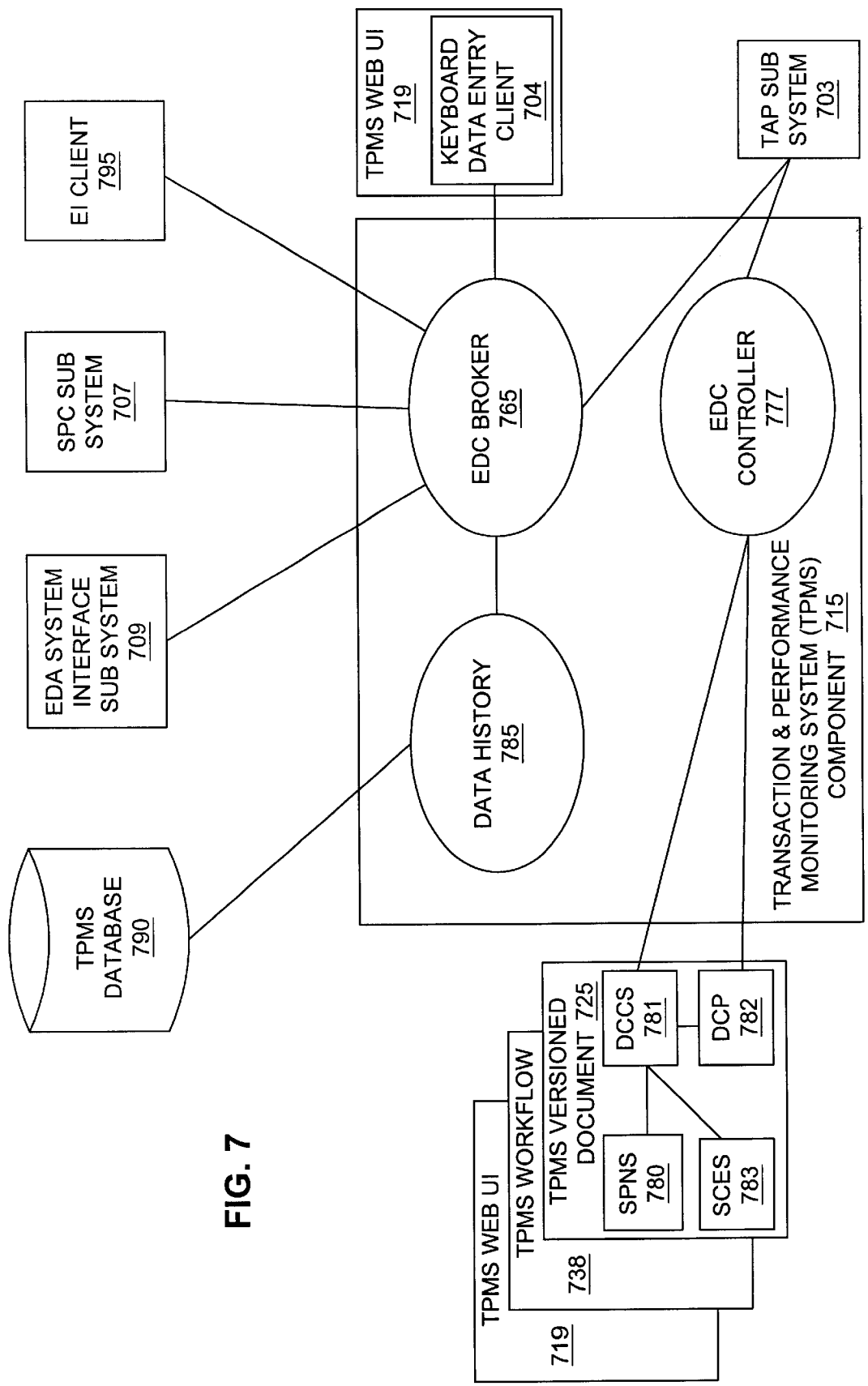
FIG. 7 is a block diagram of an engineering data collection (EDC) subsystem within the process control system according to at least one embodiment of the present disclosure.

Referring now to FIG. 7, a block diagram of the engineering data collection (EDC) subsystem according to an embodiment of the present disclosure, will be discussed. Engineering data collection (EDC) subsystem of process control system as embodied is responsible for configuring data collection, distributing collected data, and storing collected data, and is supported through underlying transaction and performance monitoring system component 715. The EDC controller 777 manages the configuration documents such as the data collection capability specification (DCCS) 781, standard parameter naming specification (SPNS) 781, standard collection event specification (SCES) 783, and data collection plan (DCP) 782 from within the transaction and processing system versioned document area 725. Data collection capability specifications 781 describe what a tool can collect. Standard parameter naming specifications 780 give a single person/group control over defining parameter names for consistency, while standard collection event specifications 783 are like an SPNS, but for collection events rather than parameter names. Data collection plans 782 describe what a particular tool should collect at a particular context.

Other application programming interfaces in support of versioned documents 725 are workflow 738, and a web user interface (UI) 719.

Engineering data collection (EDC) broker 765 accepts data from equipment interfaces 795 or tap subsystem 703, then distributes the data to all subscribers such as Data history 785, the engineering data analysis (EDA) system interface 709, and the statistical process control (SPC) subsystem 707. Engineering data analysis system interface 709 is responsible for transmitting raw data collection and process control system data to an engineering data analysis system (not illustrated). Interface 709 allows MES system data collection to be deactivated in favor of the data collection and process control system as disclosed herein. Interface 709 has a data subscription to the EDC broker 765, just like Data History 785 and SPC subsystem 707. In one embodiment, interface 709 is not a transaction and performance monitoring system component comparable to the other interfaces disclosed herein. Data history 785 subscribes to everything and stores it in the transaction and performance monitoring system's online transaction processing (OLTP) database 790. User input to engineering data collection is accomplished via web interface 719 by a keyboard data entry client 704.

When the data collection and process control system disclosed herein is used to configure engineering data collection, data collection capability specification (DCCS) and data collection plan (DCP) versions are created. However, configuring data collection and processing incoming data are two completely separate activities as far as the embodied process control system is concerned. The process control system accepts data from any source, regardless of whether or not that data was configured using a DCCS and DCP. Equipment interfaces and other systems may send data to the process control system at any time, whether a DCCS or DCP exists or not.

In general, in an embodiment of the method as disclosed herein, the DCCS defines the data collection capabilities of a tool and constrains the collection levels (e.g., wafer level, lot level, site level, and the like), the collection events (CEIDs) that a tool generates, and parameters that may be included in a DCP. The DCP defines parameters that the tools collect, and the conditions under which to collect them based upon the DCCS with which it is associated. A DCP is used for engineering data collection as disclosed herein when attached to an MES context that matches the context of an MES process automation management (PAM) action. "PAM" is a proprietary term developed by Consilium to describe their application program interface (API) to equipment interfaces. A PAM action is a message sent through that interface to an equipment interface (EI). Thus, each DCP is to be attached to at least one context, or no equipment interface (EI) will see it.

When a data collection PAM action is initiated in the MES, the EI sends the PAM action context to the process control system as disclosed herein. The process control system determines if there is a DCP attached to a context that matches the PAM action context. If there is, DCCS associated with the matching DCP is used to convert the DCP to a DCEP (Data Collection Execution Plan), which is essentially the DCP with some fields resolved for the current time and context. The EI uses the DCEP to set up EDC behavior for data sent to the process control system as disclosed herein. If no context matching DCPs are found, engineering data collection does not transpire.

Should context matching DCPs exist, the EI, through a DCEP, collects data and sends it to the data collection and process control system for storage in the OLTP database, statistical processing, and the like.

Figure 8:
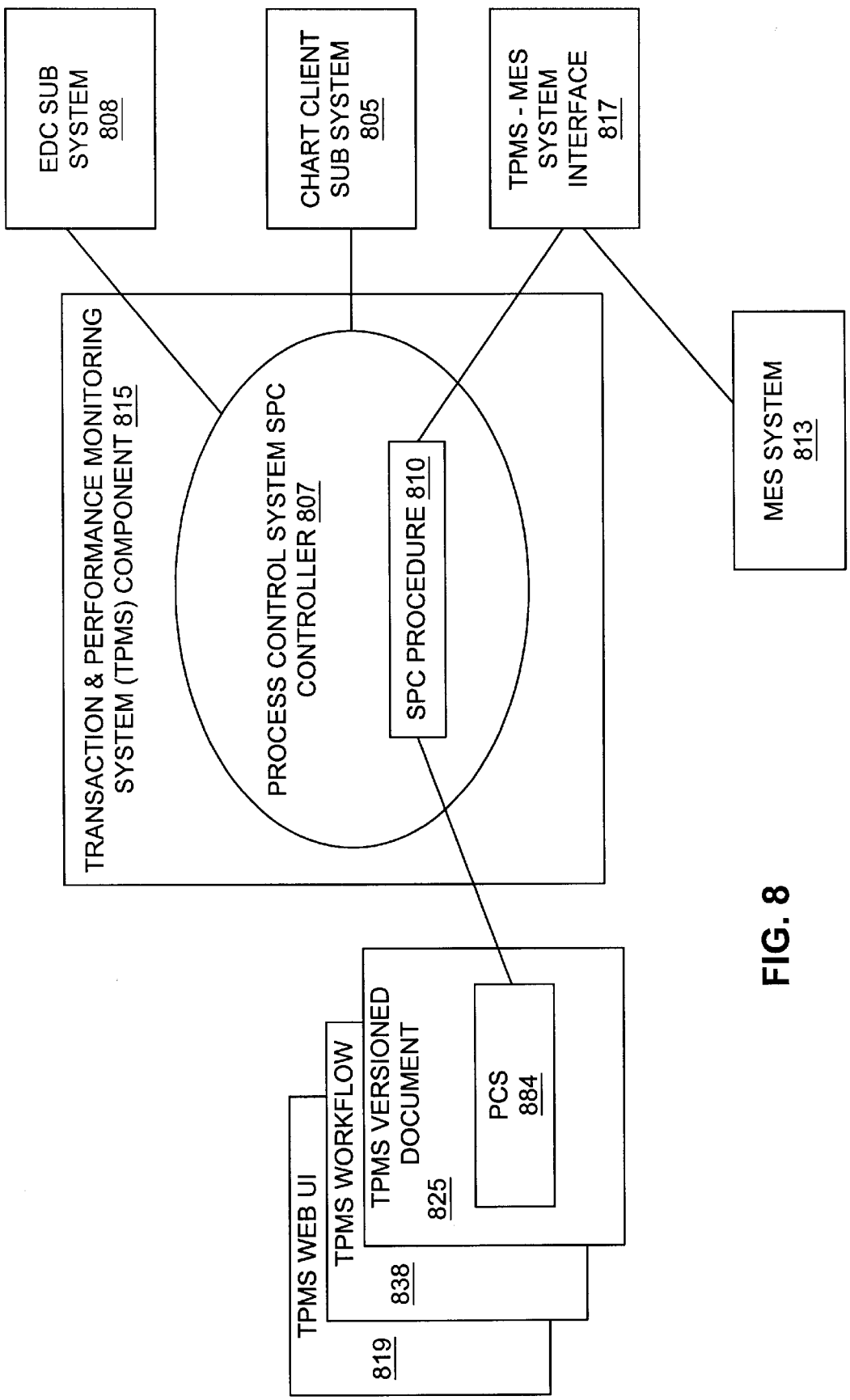
FIG. 8 is a block diagram of a statistical process control (SPC) subsystem within a process control system according to at least one embodiment of the present disclosure.

Referring now to FIG. 8, a block diagram of the statistical process control (SPC) subsystem of data collection and process control system 501 (FIG. 5) according to an embodiment of the present disclosure, is presented. The statistical process control (SPC) subsystem, which includes SPC controller 807, and SPC procedure 810, is the heart of the data collection and process control system in the various embodiments as disclosed herein. SPC is responsible for performing calculations to generate statistics on collected data, applying rules to the statistics, and executing error actions when those rules are violated, and is supported through underlying transaction and performance monitoring system component 815. The SPC procedure 810 is a statistical engine that performs what the process control strategy 884 describes. A process control strategy (PCS) 884 is an SPC configuration mechanism that defines the context at which to pull data from the database (i.e., the process to be controlled), the data to be used to calculate the statistical points (what data should be analyzed), how the data is processed and interpreted for SPC, and actions to take based upon the interpreted data ( the rules to apply and the actions to be taken when rules are violated). There is one SPC procedure 810 for each PCS 884. The PCS 884 is one of the versioned documents maintained within the transaction and processing system versioned document area 825. Other application programming interfaces in support of versioned documents 825 are workflow 838, and a web user interface (UI) 819.

The SPC controller 807 subscribes to the EDC subsystem 808 (EDC broker), and sends data to the appropriate SPC procedures 810. In at least one embodiment, the SPC controller 807 is the outside world's only way to communicate with an SPC procedure 810. SPC controller 807 sends data to the chart client subsystem 805, which allows visualization of statistics generated by SPC procedure 810 in graphical chart form. User input to create or edit process control strategy 884 is accomplished via web interface 819. SPC procedure 810 is able to communicate with MES 813 via an interface 817.

The process control strategy (PCS) 884 as disclosed herein enables a user to control a semiconductor manufacturing process by performing statistical analysis on the data collected on tools. PCS 884 is an SPC configuration mechanism that defines one or more of the following: the context at which to pull data from the database (i.e., the process to be controlled); the data to be used to calculate the statistical points; how the data is processed and interpreted for SPC; and the actions to be taken based upon interpretation of the data. PCS 884 may also define other process control elements and/or objects as desired. In one embodiment, as part of creating the PCS, the user makes the following specifications: Context Matching Specification, Pipeline Specification, Control Specification, and Symptoms, Causes and Fixes Specification. The Context Matching Specification identifies the context of the process control system data to use for SPC processing. The Pipeline Specification defines the data, at the matching context, to pull from the OLTP database for input to SPC, as well as describing how to process that data. The Control Specification describes how to interpret the processed SPC data, and defines the appropriate actions to take when out of control (OOC) conditions are detected. The Symptoms, Causes and Fixes Specification lists causes and fixes for potential symptoms.

One purpose of PCS 884 is to enable process engineers to specify how to monitor and control key components of the manufacturing process, such as process tool performance. In an embodiment of the present invention, a tool is controlled by monitoring the data collected before, during, and/or after specified processes. Information about the material processed on a tool is what links the data from process to process, and provides for logical separation of the data as disclosed herein. In an embodiment of the present disclosure, for each SPC variable that is pulled from the database for input to SPC (e.g., parameter, toolname, tooltype, attribute, and the like), the lot ID, wafer ID, site ID, die ID, product and batch may be automatically included. Generally speaking, there should be one or two PCSs per tool type, with some exceptions resulting in three or four PCSs per tool type. If, for a given process such as metal etch, a parameter is produced on multiple layers for multiple etchers, that parameter can be included in one PCS for all layers and etchers entitled, for example, Metal Etch FICD. When multiple PCSs are required, it is either because the number of parameters monitored at that context for the tool type is too large to reasonably be included in one PCS, or the parameters are collected at different times. For example, stepper parameters include a wide range of overlay parameters, such as translation errors, magnitude errors, and the like, in addition to setup parameters and critical dimension (CD) parameters. In this example, there might be two PCSs: one for overlay parameters, and one for setup and CD parameters.

PCSs are used for processing both lot-based parameters and non-lot based parameters in an embodiment of the present disclosure. Non-lot based parameters are those collected as part of a daily qualification (qual). For a given tool, non-lot based parameters would be input via a single PCS named, for example, DPS Etch Daily Qual. For PCSs that process lot-based parameters, there are typically as many as four parameters that represent all the controls for the tool type. For example, the lot-based parameters that may be used to monitor and control an etcher include mean CD, standard deviation of CD, main etch rate, overetch rate, and punchthrough etch rate. These parameters would be processed as the result of one PCS named, for example, Metal Etch.

The context matching component (not illustrated) of PCS 884 as embodied herein continuously monitors the OLTP database for data collected at MES contexts that match SPC contexts. Each time a match is found, the data is input to the SPC procedure 810, which processes the data according to the Pipeline Specification discussed earlier, and then interprets the data and takes actions as defined in the Control Specification.

Figure 9:
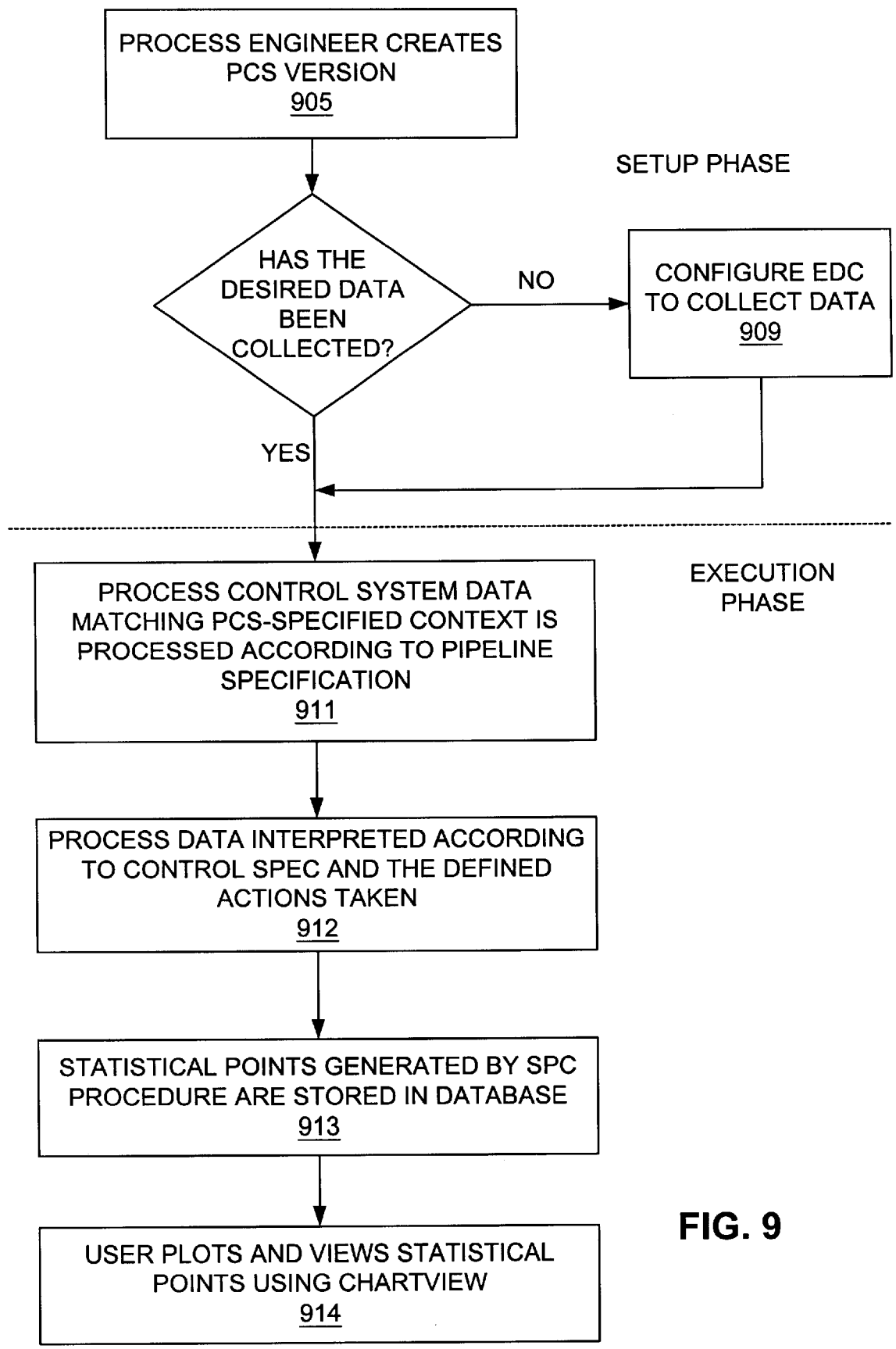
FIG. 9 is a flow diagram presenting an overview of a process control strategy (PCS) system process according to at least one embodiment of the present disclosure.

An overview of the process control system PCS process according to an embodiment of the present disclosure is presented as a flow diagram in FIG. 9. In the setup phase of the operation, a process engineer creates a process control strategy (PCS) version as in step 905. The PCS defines what data from the process control system OLTP database goes into the SPC procedure when the SPC procedure is invoked. This assumes that the data has been collected and is in the database. If the desired data has not been collected, as seen in step 907, then the EDC of the process control system as disclosed herein is used to configure data for collection via a DCCS and DCP, as in step 909. However, the embodied process control system data collection configuration is not a requirement, and data collection may be configured by other means that do not involve DCCSs and DCPs. Thus, there need not be a direct relationship between the PCS and the DCP or DCCS. After data collection has been accomplished, in the execution phase of the PCS process, the process control system data matching PCS-specified context is processed according to the Pipeline Specification in step 911. In step 912, process data is interpreted according to the Control Specification, and the actions defined in the Control Specification are taken. The statistical points generated by the SPC procedure are stored in the OLTP database in step 913. The user plots and views these statistical points using the chart client in step 914. Statistical process control charts may be accessible by means of the Internet or another network, and may be presented via a graphical user interface in various formats such as wafer maps, histograms, scatter plots, bar chart, line graphs, and the like.

Figure 10:
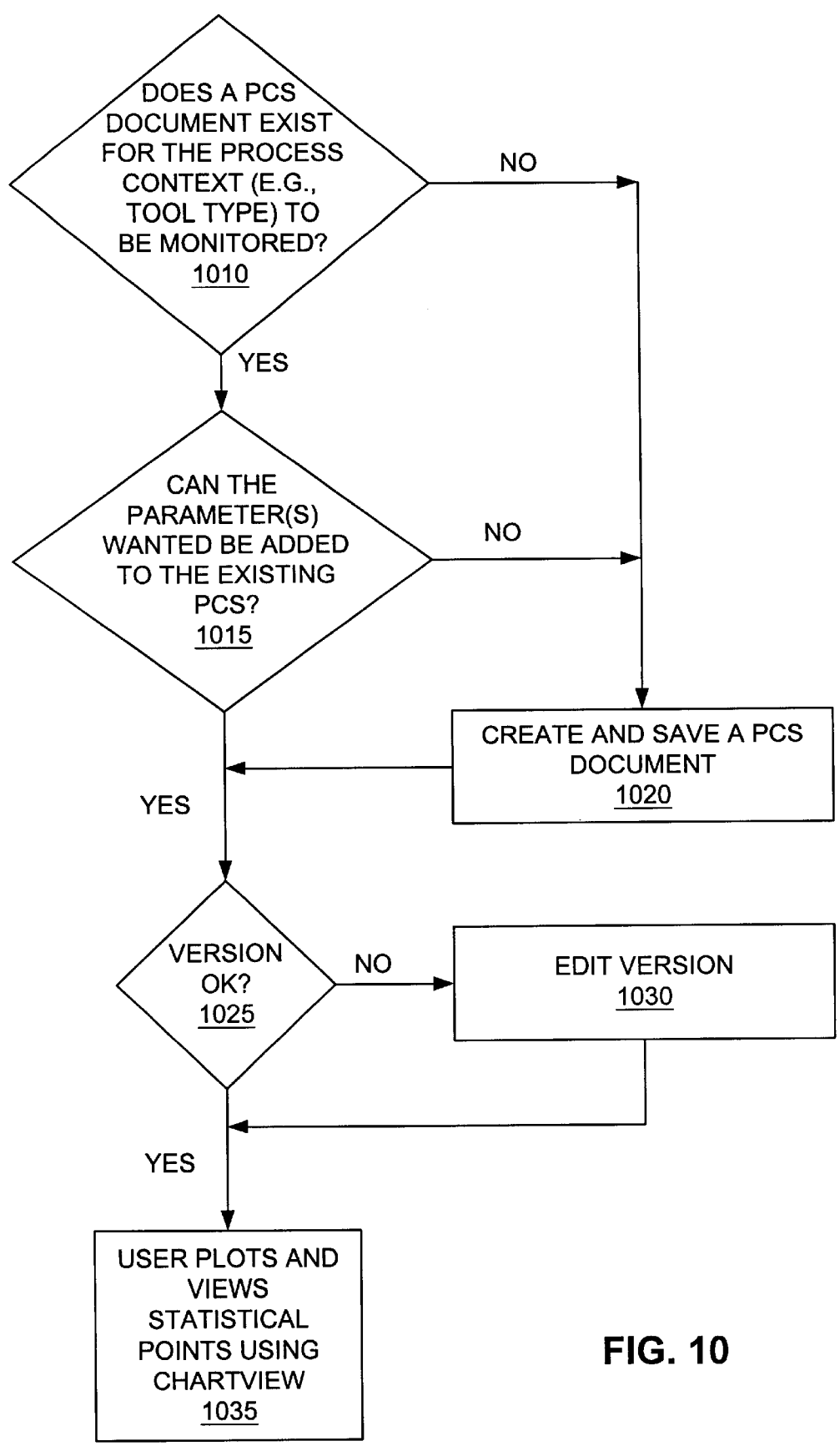
FIG. 10 is a flow diagram illustrating a PCS process according to at least one embodiment of the present disclosure.

A flow diagram illustrating use of the PCS process according to an embodiment of the present disclosure is presented in FIG. 10. A PCS document for the parameter to measure should exist, therefore determination of whether a PCS document for the process context (e.g., tool type) to be measured exists is conducted in step 1010. If a PCS process does exist, in step 1015, determination is made as to whether the parameter(s) wanted may be added to the existing PCS document. If a suitable PCS document does not exist, then a new PCS version is created and saved, as in step 1020. In step 1025, determination is made as to the suitability of the PCS version. Should the PCS version not be suitable, in step 1030 the necessary editing of the PCS version is done. Should the PCS version be suitable, the user may plot and view statistical points using the chart client, as in step 1035. If editing of a PCS version were required, after editing has been finalized, the edited PCS version would be attached to an approval flow (not illustrated). When the edited PCS version is approved by all of the approvers in the flow, it automatically becomes effective, that is, in use.

Figure 11:
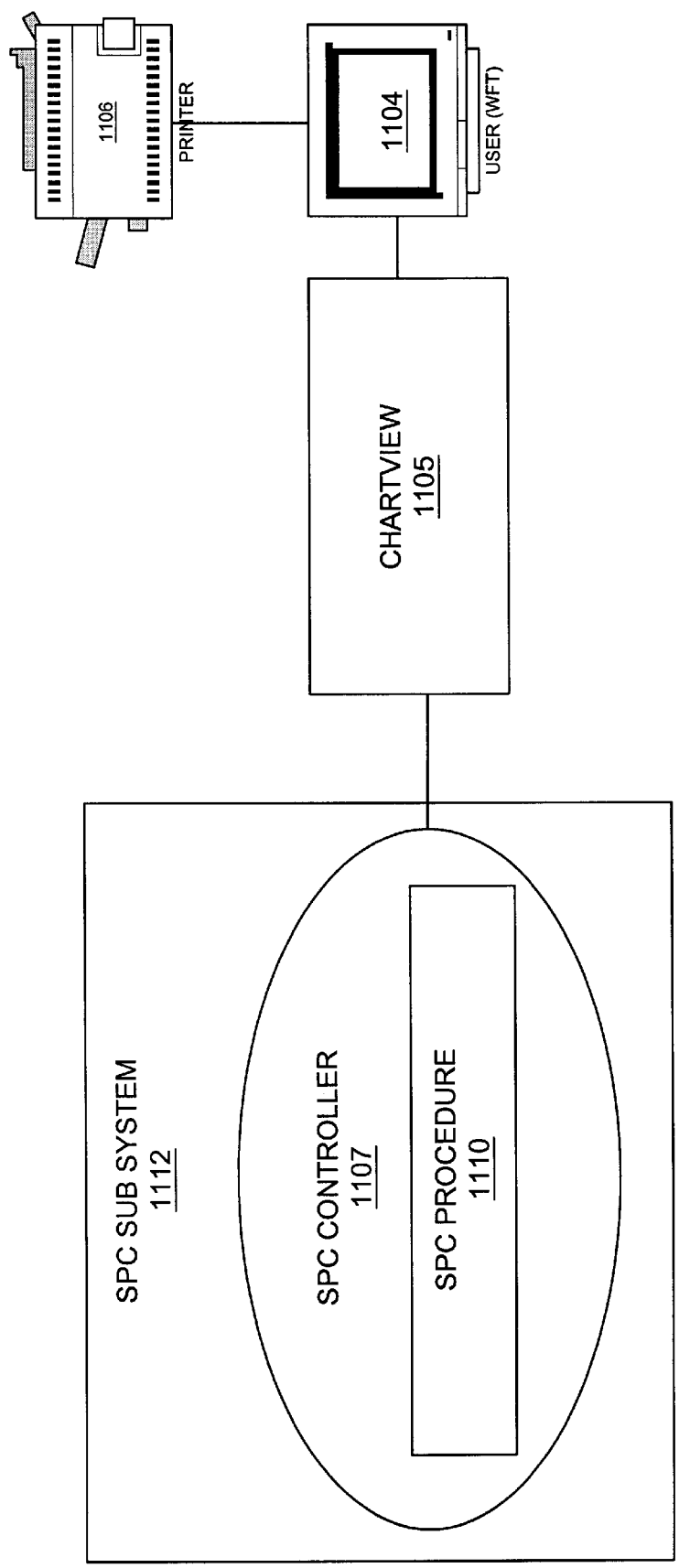
FIG. 11 is a block diagram of a chart client subsystem within a process control system according to at least one embodiment of the present disclosure.

Referring now to FIG. 11, a block diagram of the chart client subsystem within the process control system according to an embodiment of the present disclosure, will be discussed. Charts are created in the process control system as embodied herein using the PCS component. Charts may be categorized by semiconductor fabrication module, and may display data in formats consisting of wafer maps, histograms, scatter plots, bar charts, line graphs, or any other suitable format on any processing tool or metrology tool which communicates with data collection and process control system as disclosed herein. The use of chart client 1105 allows visualization of SPC procedure 1110 statistics using a graphical display 1104. Chart client 1105 also allows for printing of charts to a printer 1106, or to a file (not illustrated), should the user so desire. The chart client 1105 talks to SPC controller 1107 to obtain data and record annotations. SPC controller 1107 and SPC procedure 1110 are part of the SPC subsystem 1112. Chart client 1105 can perform certain types of "what-if" analyses, and includes a symptoms/cause/failure (SCF) graphical troubleshooting client (not illustrated). Chart client 1105 may be utilized at an MES computer terminal after data collection, and is implemented as a stand-alone thin client in at least one embodiment.

The procedure for starting chart client 1105 may depend upon whether it will be run in the fabrication facility or outside the fabrication facility on a PC or Unix workstation. In the fabrication facility, the MES can automatically initiate chart client 1105 whenever a process involving process control occurs. In this instance, the relevant chart is automatically displayed. On a desktop PC or Unix workstation outside the fabrication facility, users may view charts, for example, using a telnet session through the transaction and performance monitoring system's production server using a Unix production account.

Figure 12:
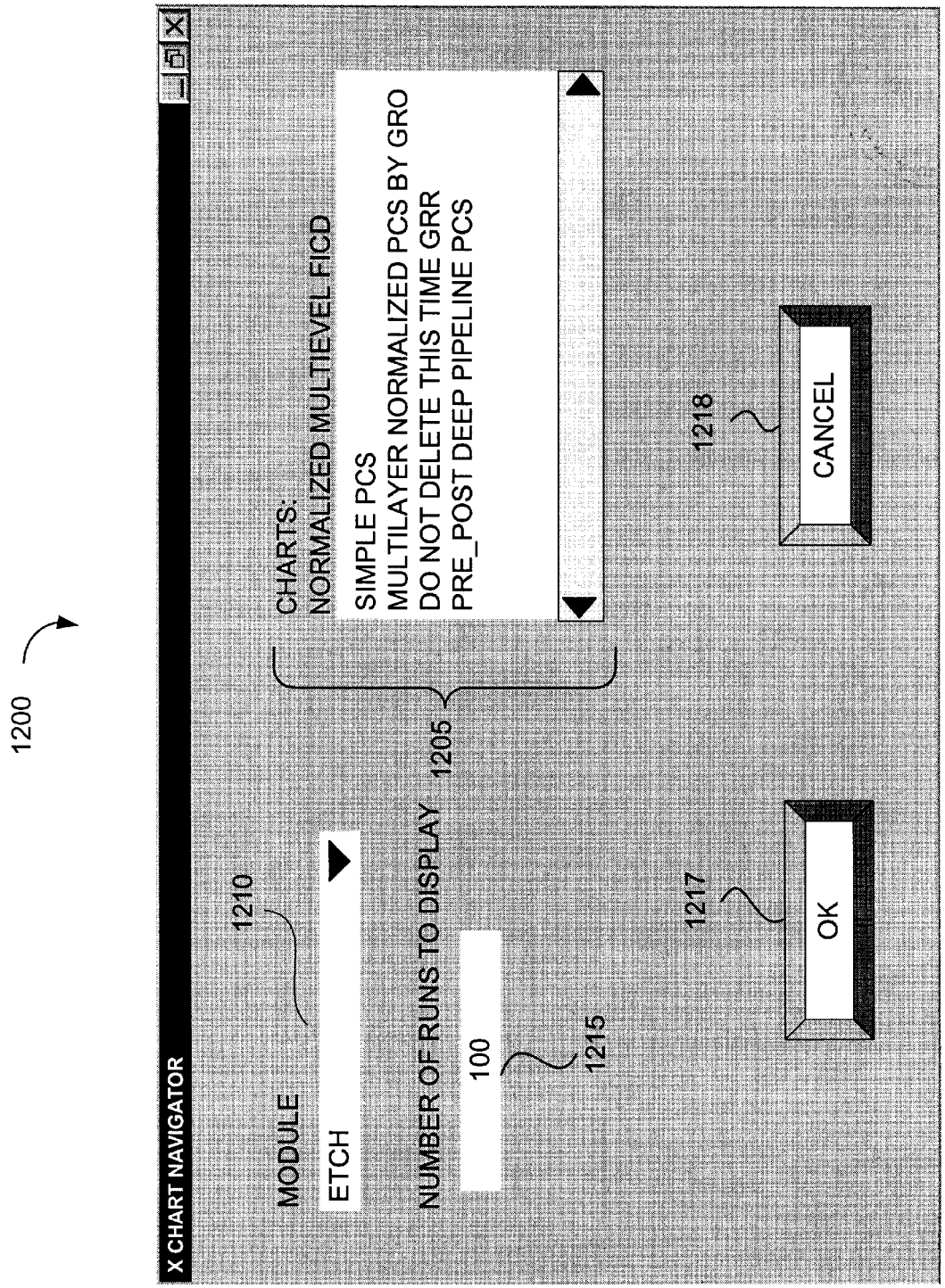
FIG. 12 shows an example of a chart navigation feature window according to at least one embodiment of the present disclosure.

An application related to chart client 1105 is a chart navigation feature, which may be used to locate and group charts for display. FIG. 12 shows an example of a chart navigation feature window according to an embodiment of the present-disclosure, and designated generally as chart navigation feature window 1200. Chart navigation feature window 1200 displays a list of charts 1205 that pertain to a user-selectable dropdown module menu 1210. In the example shown in FIG. 12, the dropdown module menu 1210 is displaying ETCH. To select one of the listed charts 1205, the user simply positions a mouse or other pointing device over the name of the listed chart to select (highlight) a particular chart name from the listed charts 1205. Similarly, the dropdown module menu 1210 may be changed to display charts that belong to another module by the user making a selection from dropdown module menu 1210. The number of runs to display field 1215 indirectly controls the number of points displayed on the chart. Direct control of the number of runs to display is specified in the PCS. The PCS is not changed from chart navigation feature window 1200, however, a user may temporarily change the value in number of runs field 1215 by editing the displayed value to the desired value. After the user has selected a chart from chart list 1205, a module from dropdown module menu 1210, and a value for the number of runs to display field 1215, a click on the OK button 1217 will display the chart. Actions may be cancelled at any time by clicking the cancel button 1218.

Figure 13:
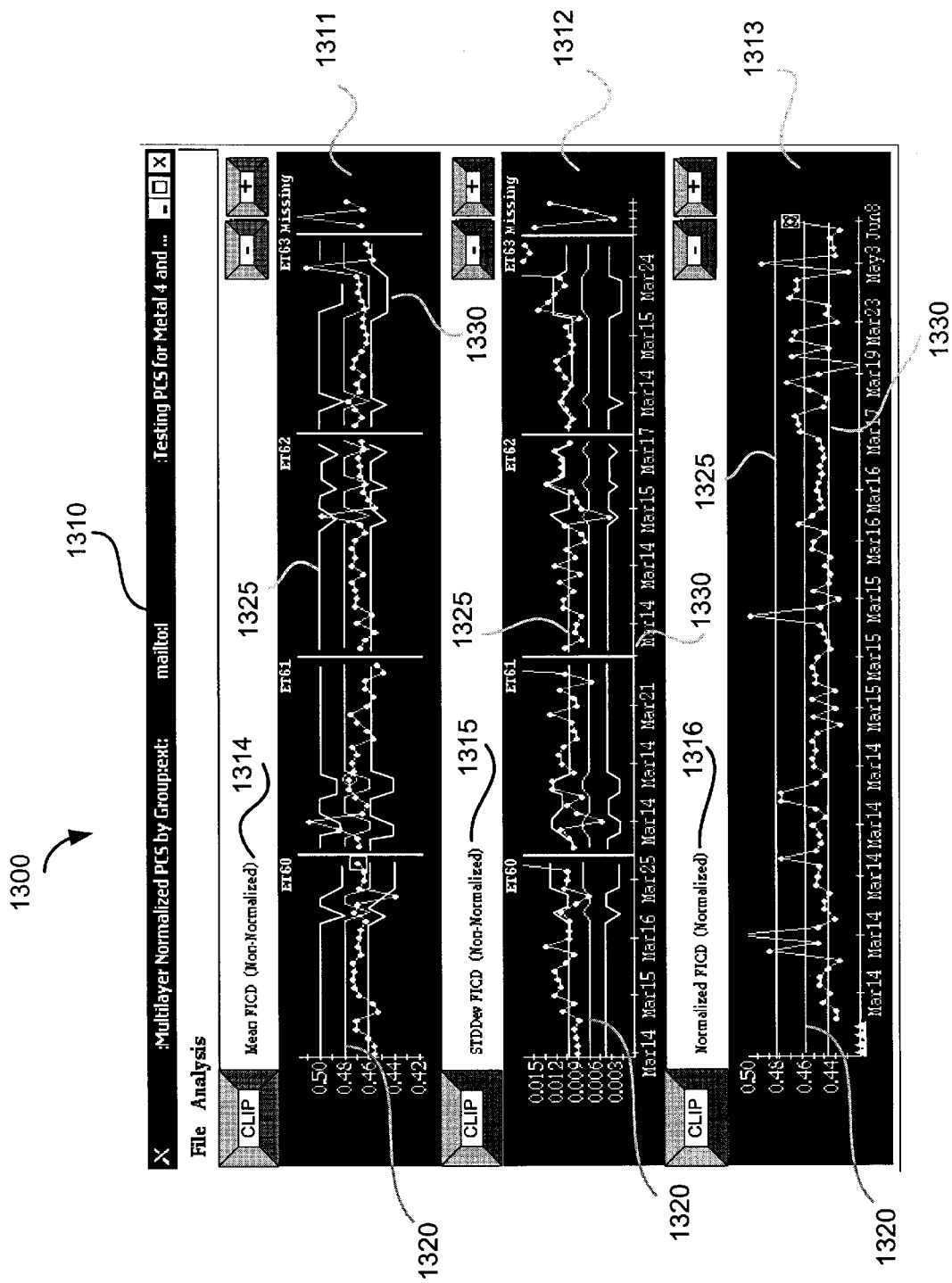
FIG. 13 shows an example of a chart created according to at least one embodiment of the present disclosure.

An example of a chart created according to an embodiment of the present disclosure is shown in FIG. 13, and referred to generally as chart window 1300. Chart name 1310 is displayed in the title bar of the chart. In one embodiment, chart name 1310 is a concatenation of information entered in the Version Information of the PCS, as follows: Criticality: Chart Owner: PCS Name: Owner Contact Info: Chart Title. Thus in the example presented in FIG. 13, the name of the chart is C: Jane Doe: Multilayer Normalized PCS by Group: ext 54321, mailto:Jane.Doe@amd com: Testing PCS for Metal 4. It will be appreciated that other suitable naming conventions can be used. Each graph 1311, 1312, and 1313 that makes up the chart window 1300 displays a different statistic, and the name of the statistic 1314, 1315, and 1316 plotted is displayed immediately above the corresponding graph, along with the normalization state of the graph in parentheses after the statistic name 1314–1316. Consequently, in our example, graph 1311 displays the statistic named Mean FICD (Non-Normalized) 1314, while graph 1312 displays the statistic named STDDev FICD (Non-Normalized) 1315, and graph 1313 displays the statistic named Normalized FICD (Normalized) 1316. It should be noted that the terms in parentheses, e.g., (Normalized) are not a part of statistic name 1314-1316, but rather an annotation added by the chart client for clarity.

When used herein, the term "normalization" or standardization, represents a mathematical transformation of a distribution's location and spread. For example, if we say X is a random variable whose distribution has a mean, A, and a standard deviation, B, and say $Y=(X-A)/B$ is a random variable whose distribution has a mean of zero and standard deviation of one. If the distribution of X is "Normal," then the distribution of Y is called "Standard Normal." However, the transformation works for our purposes whether X is Normally distributed or not. These statistics are specified in the PCS, and for each statistic listed under StatisticalPlotted Variables in the PCS, there will be a graph. The order (first to last) in which these statistics are listed in the PCS determine their order of presentation (top to bottom) in chart window 1300. On each graph 1311–1313, the target value 1320 is identified, as are the upper control limit 1325 and lower control limit 1330

By default, nothing is displayed on the x-axis of a chart client graph, as is seen in graph 1311. However, the PCS owner may choose to display any valid attribute on the x-axis by specifying an attribute defined by the PCS owner in the Pipeline Specification/Input Variables section of the PCS. For example, in graphs 1312 and 1313, measurement time was specified by the PCS owner, and is thus displayed on the x-axis.

Figure 14:
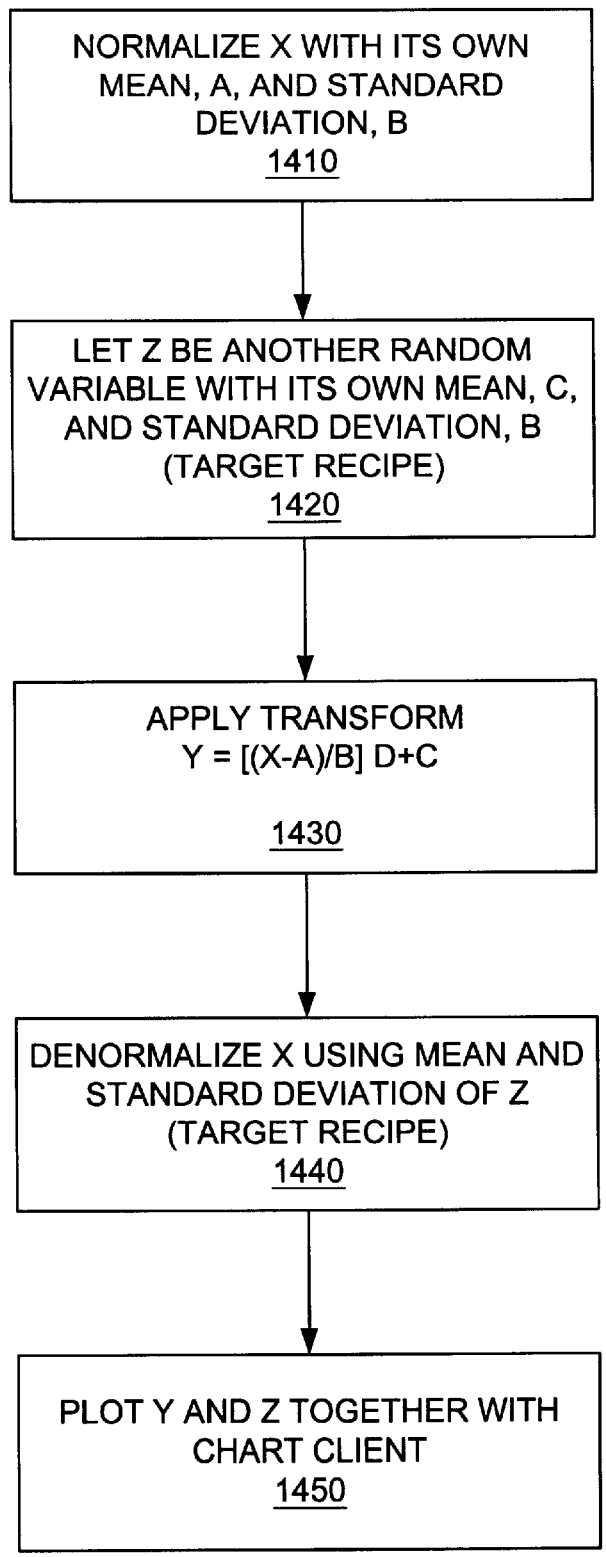
FIG. 14 is a flow diagram illustrating normalization/denormalization of data according to at least one embodiment of the present disclosure.

Referring now to FIG. 14, a flow diagram illustrating normalization/denormalization of data according to an embodiment of the present disclosure will be discussed. An embodiment of the process control and data collection system allows for data analysis and presentation techniques for statistical control data charts in ways that may enable production engineers, process engineers, wafer fabrication technicians, and other technical personnel in a semiconductor fabrication facility to positively impact the final quality of product created. For example, the chart client subsystem may be used to display data that, in addition to the standard "normalized" SPC chart, is able to be manipulated and mathematically transformed such that the data may be presented in a "denormalized" fashion as well. This is not to say that one cannot generate the standard Shewhart control charts (where the center line is process mean, and the upper and lower control limits represent the 3-sigma values from the mean) using the method as disclosed, if desired.

Each recipe performed with a semiconductor fabrication tool produces results (data) with a measurable mean and standard deviation. Knowing the mean and standard deviation of each recipe permits the application of this mathematical transformation (referred to as normalizing) to the data from that recipe. Then, because all of the normalized data has the same distribution, it may be conveniently plotted on a single SPC chart whose centerline is zero with control limits at plus and minus 3, commonly referred to as the "normalized" SPC chart or Shewhart control chart, as was discussed above. This offers the advantages of fewer charts, with more rapid accumulation of process history on a single chart as a result. Consequently, a slightly deviant tool whose use is split equally between four recipes can more quickly be detected using a single normalized chart than by using four recipe-specific SPC charts, each of which would only accumulate one fourth of the total evidence of the tool's deviance. There is a minimal time advantage when applying this technique for tools with large problems because only a single point is needed to discover large problems anyway. One problem with this normalizing technique as commonly applied is that the scale of the data changes to something unitless and unfamiliar to an end user, which may make a normalized chart confusing and difficult to interpret. An embodiment of the method as disclosed herein solves this problem by denormalizing the data to the recipe being examined (called the target recipe), and by denormalizing data from the other recipes also into the distribution of the target recipe.

An example of the technique as embodied herein is shown in FIG. 14. In the first step 1410, we let X be a random variable whose distribution has mean, A, and standard deviation, B. (X physically represents a first set of data associated with a first semiconductor process with a first set of parameters.) In step 1420, we let Z be a random variable whose distribution has mean, C, and standard deviation, D. (Z physically represents a second set of data associated with a second process with a set of parameters different from the first set of parameters.) Then in step 1430, we apply the transform Y=[(X−A)/B]D+C, 1430, as a random variable whose distribution now has a mean, C, and standard deviation, D.

Hence in step 1420, we have X normalized using its own mean and standard deviation, and then denormalized using the mean and standard deviation of Z in step 1440, in order to have the same distribution as Z, the target recipe. Then in step 1450 the values for Y and Z are plotted together utilizing the chart client as disclosed herein, thus allowing all the advantages of the normalized chart without the loss of reference produced by plain normalization. When practicing this technique as disclosed herein, as new data is plotted on a normalized chart, its recipe is the target recipe. Data from other recipes are transformed (normalized and then denormalized to the target recipe) to have the same distribution as the target recipe. Within the chart client as embodied herein, target recipe points may be highlighted, to present to the viewer an easy way to evaluate the performance of that single recipe over time. Points from other recipes are also plotted in time order, but their appearance is muted. Changing the target recipe is easily accomplished from within the chart client as embodied herein.

Figure 15:
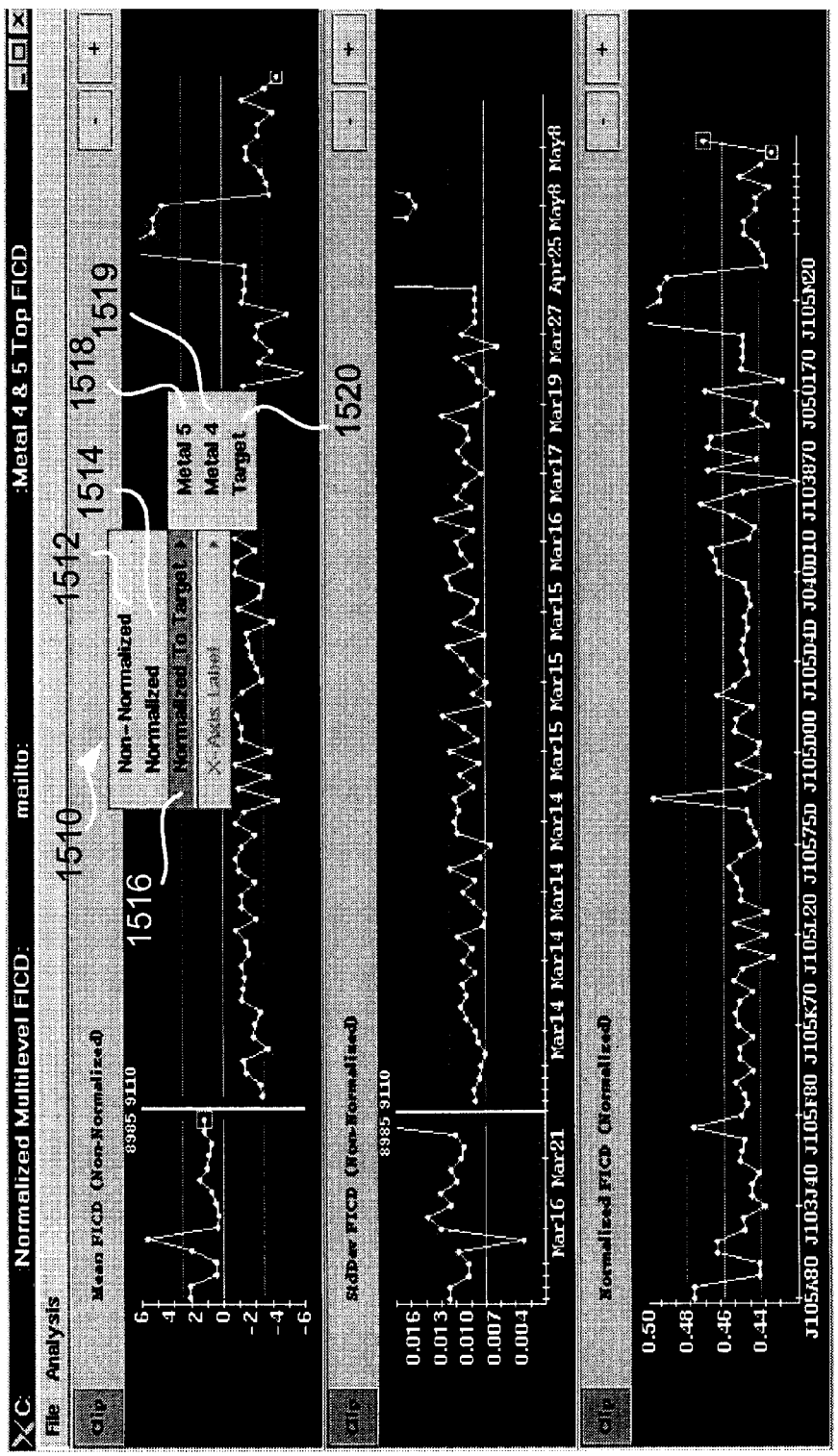
FIG. 15 is a screen shot of a chart generated according to at least one embodiment of the present disclosure.

With the method as disclosed herein, users may modify the normalization of features displayed with the chart client. In one embodiment, to change the normalization of the data on a graph, the user can simply right click with a mouse or other pointing device, anywhere inside the graph. This will display a normalization menu 1510, as seen in FIG. 15, which is a screen shot of a chart generated according to an embodiment of the present disclosure. Options selectable from normalization menu 1510 include non-normalized 1512, which means that the data displayed will not be normalized, that is, the actual statistical values will be plotted; normalized 1514, which means that the statistical data points will be normalized (standardized) using the mean and standard deviation of the process recipe associated with the data; and normalized to target 1516. When normalized 1514 is selected, the y-axis will correspond to the normalized range of the statistics, which is+/−3-sigma. As an example, if the statistics for a process Metal 4 and Metal 5 are plotted on the same graph and normalized 1514 is chosen, the Metal 4 statistics will be normalized using the mean and standard deviation for the Metal 4 recipe, and the Metal 5 statistics will be normalized using the mean and standard deviation of the Metal 5 recipe. The resulting graph will have a target value of zero, and control limits of+/−3 sigma.

The option normalized to target 1516 is used to display the statistical data points on a graph whose y-axis corresponds to the natural metric of the statistic, instead of the unitless zero, +/−3 sigma of a normalized graph. When normalized to target 1516 is selected, the data is normalized as described above, and then the normalized points are normalized again using the mean and standard deviation of the target recipe selected. Target recipes in this example are Metal 5, 1518, and Metal 4, 1519. If item target 1520 is selected instead of a target recipe, then the target recipe will automatically be the recipe associated with the most recently generated point on the graph. As an example, if statistics for Metal 4 and Metal 5 are plotted on the same graph, normalized to target 1516 is selected, and the target recipe is Metal 4, 1519, then the statistical data points would first be normalized using their own respective recipes (same as for normalized 1514 above), then the normalized data points would be normalized again using the mean and standard deviation of the Metal 4 recipe 1519. These analyses may be applied to processes that were conducted with the same machine or the same type of machines, and with individual data sets or a plurality of data sets collected from a semiconductor process measurement. These measurements may be indicative of a machine's functionality for a particular process or recipe.

Another embodiment of the present disclosure that may facilitate trend analysis is a data history reconstruction feature. The results of a history reconstruction operation are presented via the chart client subsystem by a common, graphical user interface (Internet or other network interface). Trends from past data may be imported and viewed for trend analysis. Analysis charts may be used to, for example, recalculate control limits. A viewer may select to change plotting parameters and change grouping of data for display to investigate a "theoretical" new limit, tolerance, or other parameter of interest. These changes are not permanent, and are not sent to the database for recording because the changes are for problem analysis/solving and trialing purposes. Viewers may print these variously changed charts either to a file, or to a printer as a means of preserving the trials, if desired.

An embodiment of the present disclosure allows for offline capability analysis of the semiconductor process measurement data as well. Should one wish to know if a processing machine's function could be changed from an existing specification requirement and increase the capability of the machine as a result, the method embodied herein supports this. For example, a user could select an amount of data, i.e., all of the measurements made by that tool during a period (i.e. week, month, year, machine cycle, or the like), create a histogram using the chart client as disclosed herein, and compare the outcome to see if the new process is capable of living inside the specification requirements.

The main types of changes to the input data that a user may try include, but are not limited to: data filtering based on grouping or control recipe, recalculation of graph limits based upon currently displayed statistics, and changing the grouping or ordering of the currently displayed statistics. Data may be presented graphically as histograms, scatter plots, wafer maps, bar charts, line graphs, or the like. The method involves identifying data to be processed, selecting statistical processing analyses to be carried out on the data, retrieving the identified data from storage, and evaluating the data according to the selected statistical processing analyses. The identified data may include previously recorded semiconductor process measurements as well as original process parameters of the semiconductor process measurements, whether performed by metrology tools or process tools. The framework of the distributed architecture of the data collection and process control system as embodied is such that the original process parameters and the semiconductor process measurements may be stored together, that is, accessible point by point, even if the respective measurements are stored in different tables of a relational database. This identified data may be retrieved via an interface from online transaction processing (OLTP) databases associated with the transaction and performance monitoring system components underlying the process control and data collection system embodied by the present disclosure.

Figure 16:
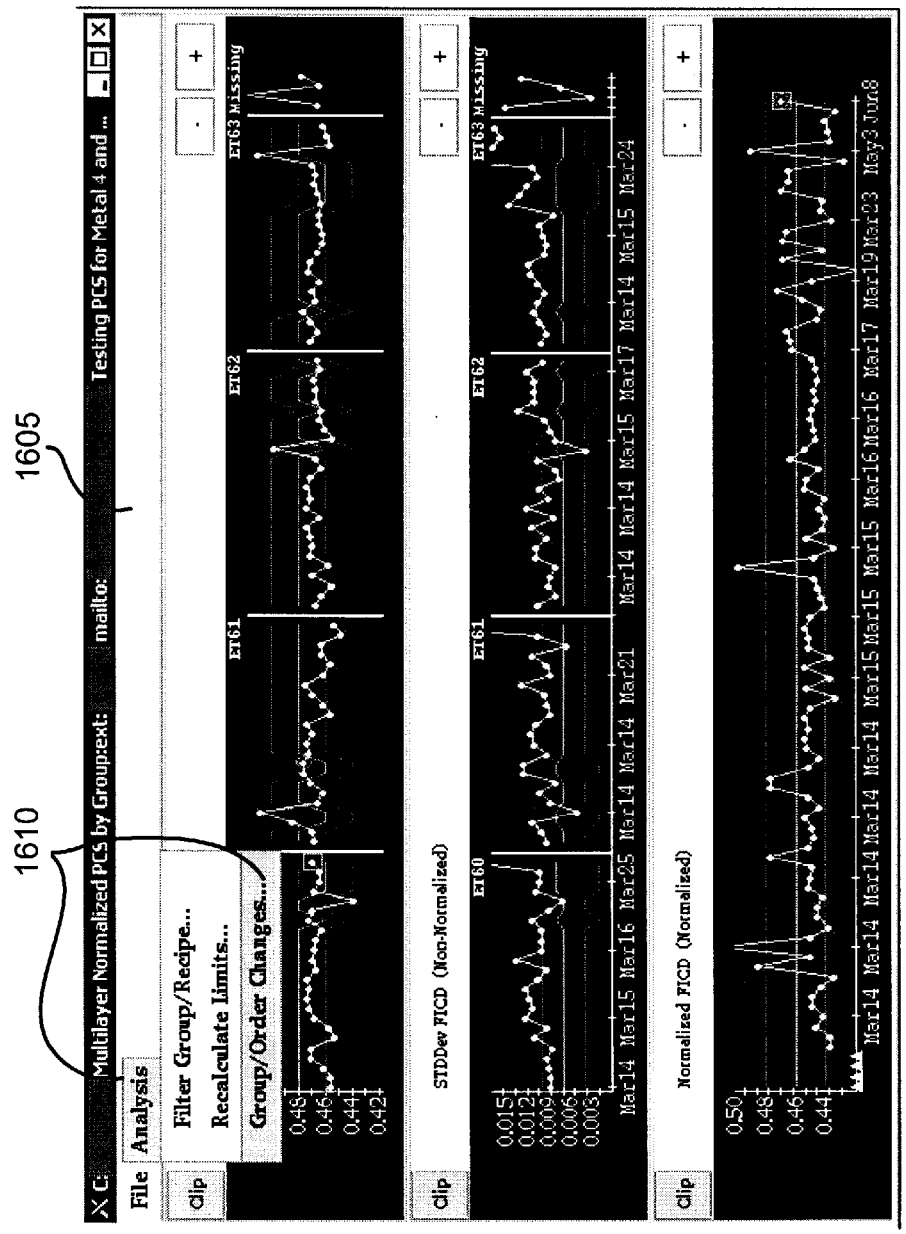
FIG. 16 is a screen shot of another chart generated according to at least one embodiment of the present disclosure.

In an embodiment of the disclosure, a user may change groupings and/or ordering of identified and selected statistics and display a new grouped chart of the change in grouping and/or ordering using a common graphical user interface. This change of grouping or ordering feature is accomplished with the chart client. This is shown in FIG. 16, which is a screen shot of a chart generated according to an embodiment of the present disclosure. Grouping and ordering of the chart client graphs are specified in the Control Specifications/Statistics section of the process control strategy (PCS) as disclosed herein. However, a user may temporarily regroup or reorder data statistics from within the chart client for experimentation or trial purposes. To change the grouping or ordering of the data on a graph, the user may select Analysis→Group/Order Changes tab 1610 from menu bar 1605.

Figure 17:
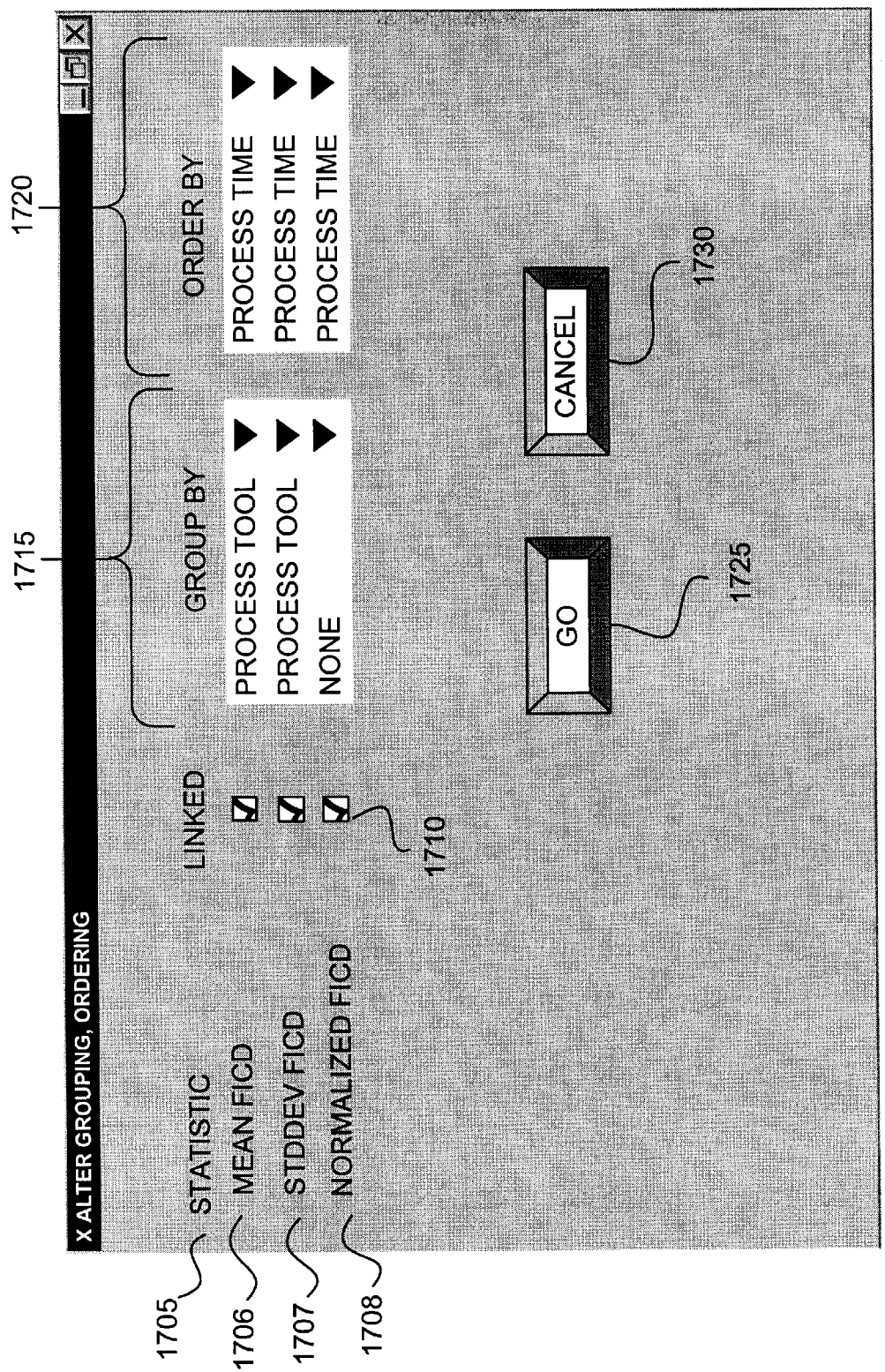
FIG. 17 shows an Alter Grouping, Ordering window created according to at least one embodiment of the present disclosure.

This action will launch a new window, shown in FIG. 17, and referred to as Alter Grouping, Ordering window 1700. For each statistic (i.e., graph) 1705, the user makes the desired selections from the Linked checkboxes 1710, Group By drop down menus 1715, or Order By drop down menus 1720. The linked option is used to facilitate grouping and ordering changes. The user selects the Linked checkbox 1710 to link the statistic to any other statistic whose Linked checkbox 1710 is checked. When the grouping or ordering of any linked statistic is changed, that attribute will be changed for all linked statistics.

For example, if the group by attribute for Mean FICD 1706 is changed to Product (not shown) in the Group By drop down menu 1715 associated with Mean FICD 1706, the group by attribute for StdDev FICD 1707 and Normalized FICD 1708 will automatically be changed to Product because all three statistics are linked by having their respective Linked checkboxes 1710 checked, as illustrated in FIG. 17. A user selects from the Group By drop down menus 1715 to change an attribute on which grouping is based. Examples of some choices available from the Group By drop down menus 1715 may include lot, product, recipe, or operation. A user selects from the Order By drop down menus 1720 to change an attribute on which ordering is based. Examples of some choices from Order By drop down menus 1720 may include processing time at some prior context, metrology time, or lot number. The Go button 175 is selected to regenerate the graphs and display the new grouped and/or ordered chart. To cancel the operation, the user selects the Cancel button 1730.

In an embodiment of the present disclosure, the chart client has methods for identifying key graph points. For example, a blue box can be displayed around the most recently generated point on a graph, a green circle can be displayed around a point that has been annotated, a triangle along the x-axis can be used to denote a missing statistic, and a yellow box to identify a selected point. For example, when the user selects a point by clicking once on it, a yellow box may be displayed around that point. At the same time, a yellow box is displayed around those points corresponding to the same data that generated the selected point on the other graphs in the chart window. A small red "x" can be used to cover an "out of control" point as defined in the PCS. No action is required by the user for this condition, as a small red "x" implies that the process control system as embodied did not shut down the tool or put the lot on hold. However, a large red "X" used to cover an "out of control" point as defined in the PCS might indicate that the process control system as disclosed herein has either shut down the tool or put the lot on hold, and would indicate that action is required by the user.

Figure 18:
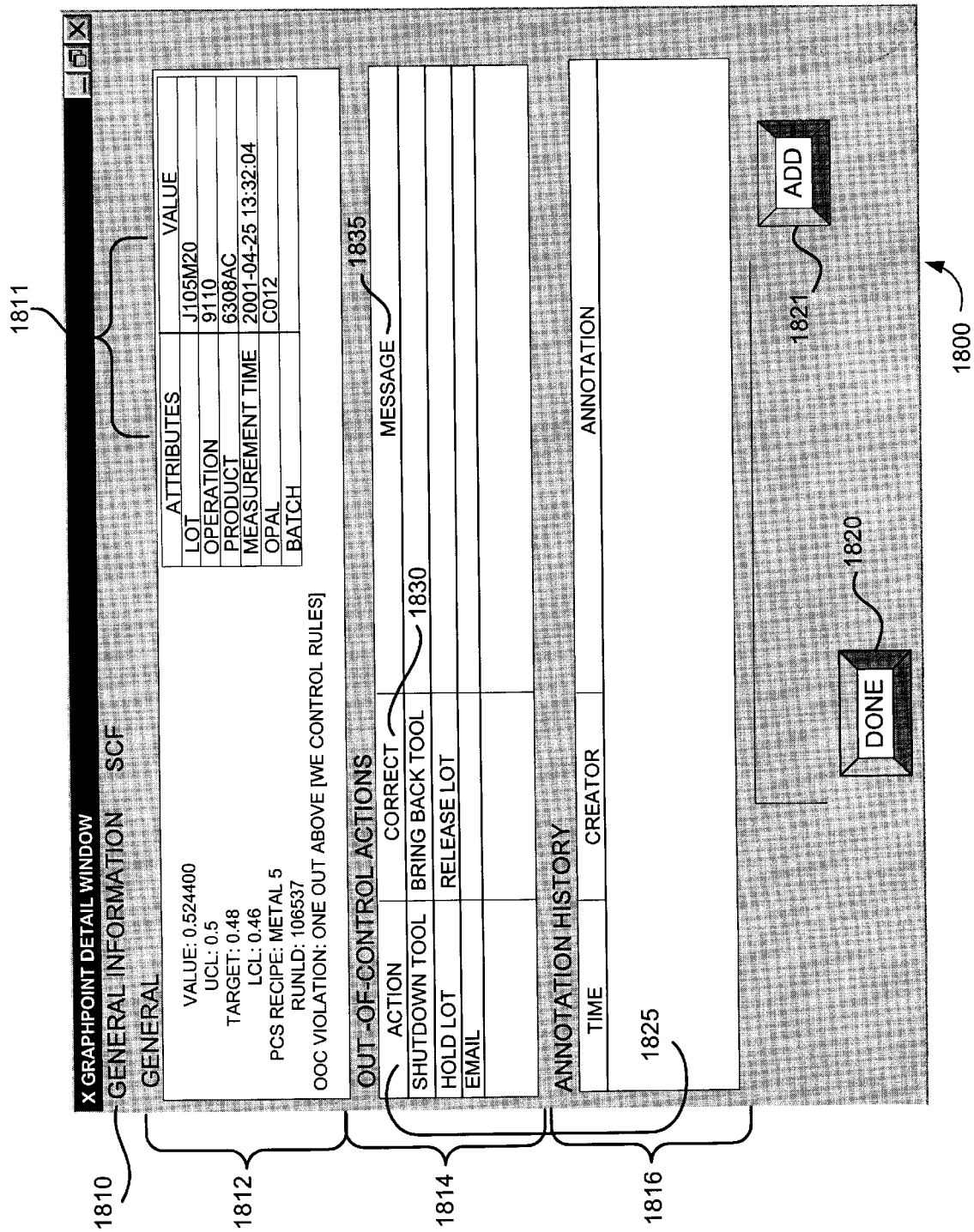
FIG. 18 shows a Graph Point Detail Window created according to at least one embodiment of the present disclosure.

A user may select this point by double-clicking on the large red "X" to display information regarding the out of control point in Graph Point Detail Window 1800 as illustrated in FIG. 18 The General Information tab 1810 of Graph Point Detail Window 1800 displays data about the selected point in one of several areas: an attribute and value area 1811, a general area 1812, an out-of-control actions area 1814, and an annotation history area 1816. Users may create an annotation for any point displayed with Graph Point Detail Window 1800 by entering text in area 1820 and clicking the add button 1821. The annotation is added, and the point on the graph will be circled.

General area 1812 displays various fields such as the value of the selected point, the upper control limit (UCL) of the graph containing the point, the target value for the graph containing the 10 point, the lower control limit (LCL), the PCS Recipe, Run ID number, and out of control (OOC) violation. The attribute and value area 1811 lists the attributes defined in the PCS and their corresponding values. The out-of-control actions area 1814 lists the action(s) that were taken by the process control system as disclosed herein in the "Action" column 1825 for the selected out-of control point, for example, shut down the tool, hold the lot, or (sent) Email to the person listed in the PCS. If no actions were taken by the process control system, Action column 1825 would be blank. For each action listed in Action column 1825, the "Correct" column 1830 would contain an active button. After taking the appropriate corrective action, the user selects this button to undo the corresponding action, i.e., to bring the tool back up or release the lot from hold. A message from the MES is displayed in the Message column 1835 if the user action to bring the tool back up or release the lot from hold failed. Otherwise, nothing is displayed in Message column 1835.

Figure 19:
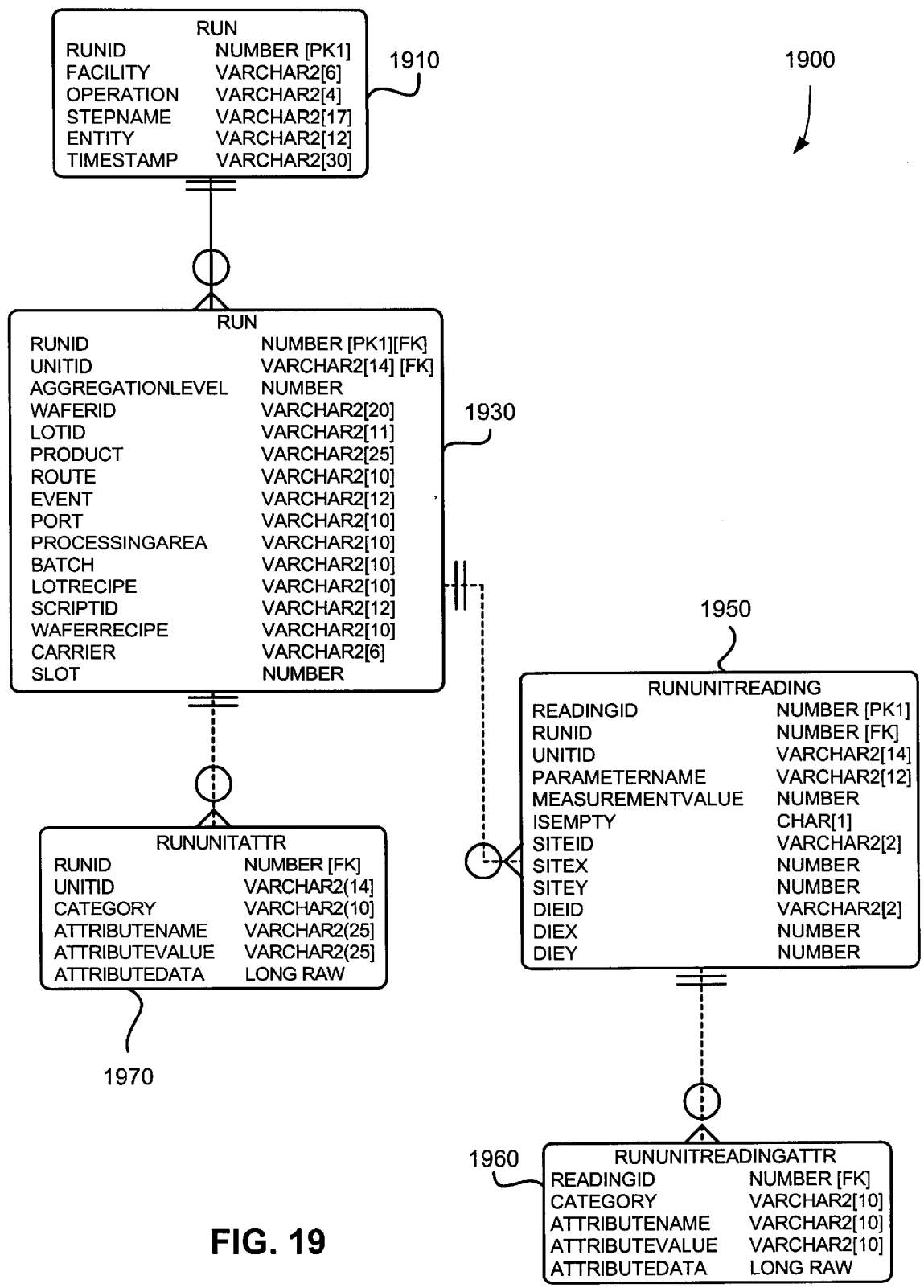
FIG. 19 shows a database schema according to at least one embodiment of the present disclosure.

Referring now to FIG. 19, the database schema according to an embodiment of the present disclosure, generally referred to as database schema 1900, will be discussed. The schema, or structure of the database, defines the tables, the fields in each table, and the relationships between fields and tables. The term schema is also used to refer to a graphical depiction of the database structure, such as that seen in FIG. 19. The functionality of various embodiments disclosed herein may be improved by employing the database methodology discussed below in the requirements analysis phase for data collection and process control. Relational database technology as used in the embodied system as disclosed herein generally consists of a set of interconnected tables, such as the various tables seen in schema 1900. One such table is Run table 1910, which is the top-level table when data is submitted. Each report of data to the data collection and process control system from a client application inserts a row into Run table 1910. A "run" as used here refers to a quantity of data collected on material that was processed together so, for example, a row in the run table may equate to data on three wafers, where each table has a field or an amalgamation of fields that uniquely identifies each record (tuple) in the table. This unique identifier is referred to as a primary key. A primary key is a field that uniquely identifies a record in a table. Primary keys are identified with brackets, i.e., [PK1] in schema 1900. An example of a primary key, for example, appears in Run table 1910 at the end of the RUNID row, which indicates that RUNID is a primary key.

In addition, the method as disclosed herein utilizes foreign keys as well. A foreign key represents the value of a primary key for a related table. That is, a foreign key is a field or collection of fields in one table whose values match the values of the primary key of a different table. However, a foreign key may not need to be a primary key as disclosed herein. Foreign keys are also identified with brackets, i.e., [FK] in schema 1900. In an embodiment, a first primary key identifying a semiconductor run is stored in a first table of a relational database, and a second primary key identifying a production unit is stored in a second table of a relational database. Also stored within the second table is a first foreign key to associate the production unit with the semiconductor production run, and information identifying an aggregation level of the production level. A third table stores process measurement information, and a third primary key identifying a production unit reading, as well as the first primary key to associate process measurement information with the semiconductor production run, and the second primary key to associate the process measurement information with the production unit.

An example of the use of primary and foreign keys is, seen in RunUnitReadingAttr table 1960, and RunUnitReading table 1950. In RunUnitReadingAttr table 1960, the row READINGID is indicated to be a foreign key [FK], with the corresponding primary key [PK1] being located in RunUnitReading table 1950 as READINGID. The RunUnitReading table 1950 contains the measurements, and is for numeric readings only—string parameter readings are stored in the RunUnitReadingAttr table 1960. Another example is seen in RunUnit table 1930, which has a primary key containing the data in both RUNID and UNITID together. In RunUnit table 1930, a row is inserted for each of the units in the run, where a unit is a lot, wafer, site, and the like, depending on the aggregation level. The RunUnitAttr table 1970 contains any additional information about a unit that is the submitter of the data sent with it. The format used in RunUnitAttr table 1970 is a name/value/BLOB (binary large objects) tuple (record). RunUnitReadingAttr table 1960 serves the same purpose as RunUnitAttr table 1970, but contains additional information about readings on those units, not the units themselves.

An embodiment of the method comprises storing information about a first semiconductor process measurement in a first table of a relational database, where the first process measurement is associated with a first unit with a first aggregation level, and storing information about a second semiconductor process measurement in the first table, the second process measurement associated with a second unit with a second aggregation level different from the first aggregation level. An aggregation level is the level at which the records are being described and controlled, that is, aggregation is an object made up of other objects. In an embodiment, the stored information from the first table is associated with a second table of the rational database, and information characterizing the first unit is stored in the second table, as is information characterizing the second unit. The information characterizing the first unit includes information specifying the first aggregation level, and the information characterizing the second unit includes information specifying the aggregation level. Further, the second table may be associated with a third table of the relational database, and the third table may store information characterizing a first product run associated with the first unit, and information characterizing a second product run associated with the second unit. As disclosed herein, aggregation levels may be selected from a group which includes batches, lots, and wafers. The information stored about the various process measurements may include various attributes such as die-level measurements, wafer-level measurements, site-level measurements, coordinate-level measurements, calculated results based on a plurality of measurements, or various mixtures thereof. For example, a lot-averaged measurement and a set of particular die measurements on a particular wafer could be considered aggregation levels. The use of aggregation levels and primary and foreign keys in schema 1900 enables the storage of control limits with each data point such that when the data is retrieved, the data "remembers" what the limits were when it was stored. These old limits may be plotted with the chart client subsystem as embodied, along with "new" limits, should a process change control limits during a process evolution.

As seen in FIG. 19, each of the rows contains a tuple (record) with a descriptive name. The names are generally descriptive of the information within a tuple, and may be defined as follows:

RUN table 1910 terms:
RUNID—Identifier (ID) for a run. RUNID is the foreign key for Run table 1910.
FACILITY—Facility where data was generated, e.g., Fab 10
OPERATION—Operation is a MES system term to describe a particular set of processing at a particular layer, generally identified by a four-digit number, e.g., Operation 2270 might be gate critical dimension metrology. There are scripts at each operation that define the details of how to accomplish processing for that operation.
STEPNAME—A user-friendly name for a particular processing point, for example "TEOS deposition"
ENTITY—Almost always identifies a tool
TIMESTAMP—Timestamp assigned by MES system at the beginning of a transaction
RUNUNIT table 1930 terms:
RUNID—Identifier (ID) for a run.
UNITID—Identifies a thing that was measured. For example, when the aggregation level is lot, the unit ID is a lot ID, and when the aggregation level is a wafer, the unit ID is a wafer ID, and so on.
AGGREGATION LEVEL—the level at which the records are being described and controlled, that is, an aggregation level is an object made up of other objects.
WAFERID—The vendor scribe, which is a unique code physically inscribed on the wafer.
LOTID—Identifier for a lot. A lot is a cassette full of wafers.
PRODUCT—type of product being manufactured, e.g., the type of chip being manufactured on a wafer
ROUTE—MES or rework route
EVENT—something that happens to an entity, i.e., represents some command to a tool
PORT—input to tool, e.g. cassettes
PROCESSINGAREA—a chamber
BATCH—The number of wafers or lots that a tool processes in a single run
LOTRECIPE—recipe used to manufacture lot
SCRIPTID—Identification of processing script used for a given route for a given unit. The script is specific to a route (which is specific to a product) and an operation.
WAFERRECIPE—When a tool runs multiple successive recipes on each wafer, the wafer recipe reports each of the recipes that was used.
CARRIER—tray used to transport product
SLOT—location in carrier
RUNUNITREADING table 1950 terms:
READINGID—A surrogate key which is used to identify a reading uniquely.
RUNID—Identifier (ID) for a run
UNITID—Identifies a thing that was measured. For example, when the aggregation level is lot, the unit ID is a lot ID, and when the aggregation level is a wafer, the unit ID is a wafer ID, and so on.

PARAMETERNAME—a name for the physical quantity being measured

MEASUREMENTVALUE—the numerical value of the measured data

ISEMPTY—A flag indicating whether or not the reading is an actual reading or a gap representing a missing reading.

SITE ID—Identifier for where on a wafer a reading was taken. Site ID is a code that varies from tool to tool.

SITEX—coordinates of the measurement site; the coordinate scheme and origin differ from tool to tool SITEY—coordinates of the measurement site; the coordinate scheme and origin differ from tool to tool DIEID—similar to the corresponding site locations, except these readings indicate a chip on a wafer instead of a point DIEX—similar to the corresponding site locations, except these readings indicate a chip on a wafer instead of a point DIEY—similar to the corresponding site locations, except these readings indicate a chip on a wafer instead of a point RUNUNITREADINGATTR table 1960 terms:

READINGID—foreign key identifying the reading to which this attribute applies

CATEGORY—identifies the kind of attribute this is

ATTRIBUTENAME—a name assigned to the attribute

ATTRIBUTEVALUE—value assigned to an attribute. If ATTRIBUTEVALUE is anything other than a BLOB, the value is converted to a string and stored here.

ATTRIBUTEDATA—if data type of attribute is BLOB, the data is here

The terms RUNID, UNITID, CATEGORY, ATTRIBUTENAME, ATTRIBUTE VALUE, AND ATTRIBUTE DATA in RUNUNITATTR table 1970 are analgous to the terms in RUNUNITREADINGATTR table 1960, but describe units instead.

Upon consideration of the teachings set forth herein, it will become apparent that the use of features such as aggregation levels, or the use of UNITID as a single key for the RUNUNITREADING table 1950, whether it be a batch or a lot, provides a way to relate the tables in a minimalist fashion, saving time and storage space.

Figure 20:
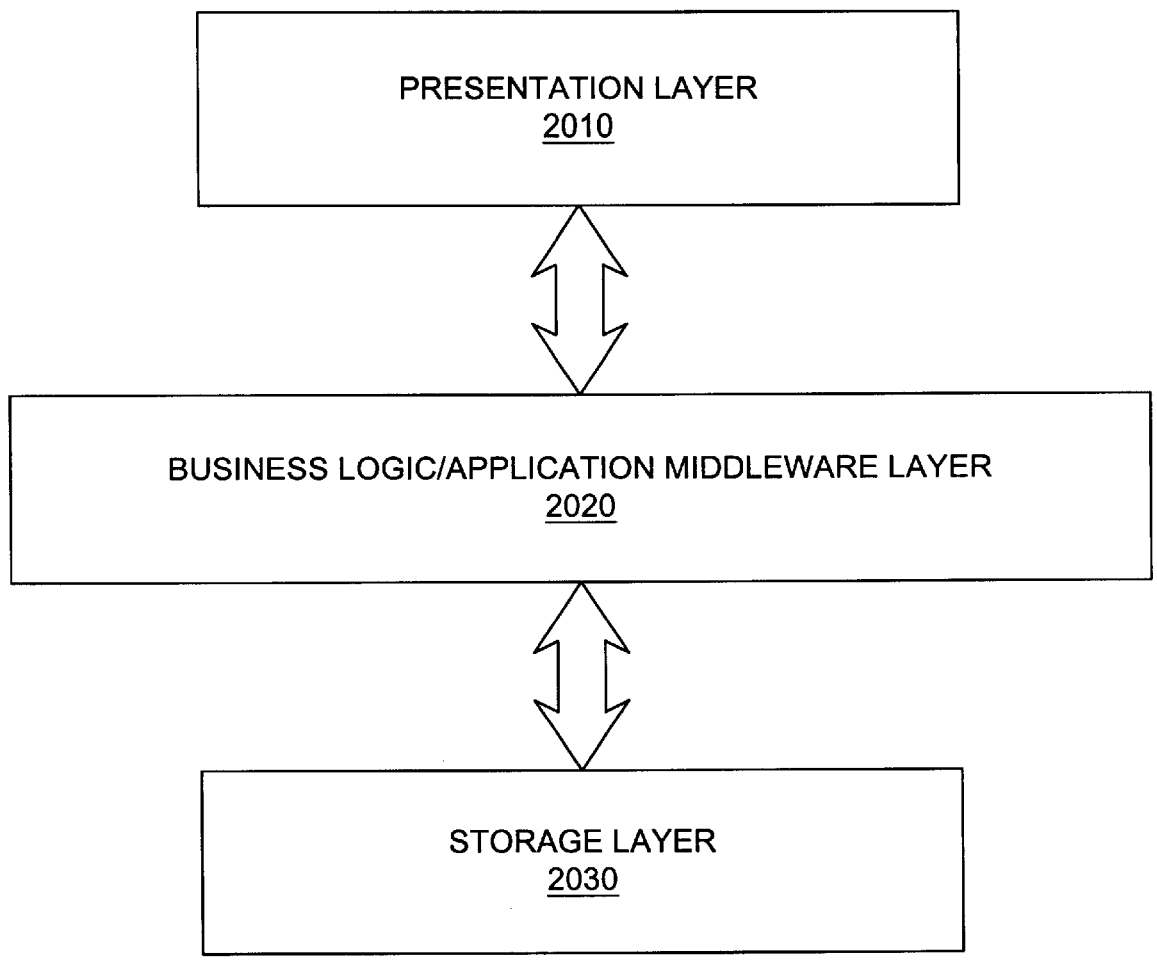
FIG. 20 illustrates the overall system architecture according to at least one embodiment of the present disclosure.

As shown in FIG. 20, the software system of an embodiment of the present disclosure may utilize a three-tier architecture (browser, web server, database). The highest tier 2010 is the Presentation Layer, the object-oriented remote method invocation (RMI) environment consisting of the menus, buttons, dialog boxes, charts and other items able to be seen by the user. The middle tier 2020 contains the Business Logic/Application Middleware Layer such as the Java server components that are responsible for distributing objects across servers and networks (i.e., the Internet). The lowest tier 2030, the Storage Layer, is a database containing raw production data that is connected by the Middleware Layer to other servers and the Presentation Layer. Oracle may be used as the database management system in lowest tier 2030. It should be noted that other architecture, such as a four-tier architecture (browner, web server, application server, database), may also be employed to practice the teachings as disclosed herein.

The various functions and components in the present application may be implemented using a data processor, or a plurality of data processing devices. Such a data processor may be a microprocessor, microcontroller, microcomputer, digital signal processor, state machine, logic circuitry, and/or any device that manipulates digital information based on operational instruction, or in a predefined manner. Generally, the various functions and systems represented by block diagrams are readily implemented by one of ordinary skill in the art using one or more of the implementation techniques listed herein. When a data processor for issuing instructions is used, the instruction may be stored in memory. Such a memory may be a single memory device or a plurality of memory devices. Such a memory device may be read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. Such an information handling machine may be a system, or part of a system, such as a computer, a personal digital assistant (PDA), a hand held computing device, a cable set-top box, an Internet capable device, such as a cellular phone, and the like.

One of the implementations of the invention is as sets of computer readable instructions resident in the random access memory of one or more processing systems configured generally as described in FIGS. 1–19. Until required by the processing system, the set of instructions may be stored in another computer readable memory, for example, in a hard disk drive or in a removable memory such as an optical disk for eventual use in a compact disc (CD) drive or digital video disc (DVD) drive or a floppy disk for eventual use in a floppy disk drive. Further, the set of instructions can be stored in the memory of another processing system and transmitted over a local area network or a wide area network, such as the Internet, where the transmitted signal could be a signal propagated through a medium such as an ISDN line, or the signal may be propagated through an air medium and received by a local satellite to be transferred to the processing system. Such a signal may be a composite signal comprising a carrier signal, and contained within the carrier signal is the desired information containing at least one computer program instruction implementing the invention, and may be downloaded as such when desired by the user. One skilled in the art would appreciate that the physical storage and/or transfer of the sets of instructions physically changes the medium upon which it is stored electrically, magnetically, or chemically so that the medium carries computer readable information. The preceding detailed description is, therefore, not to be taken in a limiting sense, and the scope of the present invention is defined only by the appended claims.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present invention is defined only by the appended claims.

What is claimed is:

1. A method comprising the steps of:
   receiving measurement data at a data broker, wherein the data broker updates a data history based on the measurement data;
   providing a trigger from the data broker, based on receiving the measurement data at the data broker, to a statistical process control (SPC) system during a semiconductor manufacturing process to trigger an SPC procedure;
   evaluating the measurement data received at the data broker in accordance with a process control strategy, the step of evaluating being performed by the statistical process control system; and
   implementing, through the statistical process control system, control actions based on the step of evaluating.

2. The method as in claim 1, wherein the step of receiving includes receiving the measurement data in real-time.

3. The method as in claim 1, wherein the step of evaluating includes performing statistical process analysis on the measurement data.

4. The method as in claim 1, wherein the step of evaluating includes performing capability analysis on the measurement data.

5. The method as in claim 1, wherein the step of implementing includes placing a unit of semiconductor material in a hold status.

6. The method as in claim 5, wherein a unit is one of: a batch, a lot or a wafer.

7. The method as in claim 1, wherein the step of implementing includes making a machine unavailable for use.

8. The method as in claim 1, wherein the step of implementing includes making a machine available for use.

9. The method as in claim 1, wherein the step of implementing includes releasing a unit of semiconductor material from a hold status.

10. The method as in claim 7, wherein the machine is a metrology tool.

11. The method as in claim 7, wherein the machine is a semiconductor processing tool.

12. The method as in claim 7, wherein the machine is a chamber within a semiconductor processing tool.

13. A method comprising the steps of:
    maintaining a data collection plan accessible to a statistical process control system wherein the data collection plan defines parameters to be collected by a tool;
    receiving, through a user interface of the statistical process control system, a process control strategy;
    verifying, using the statistical process control system, that the process control strategy is consistent with the data collection plan; and
    evaluating semiconductor measurement data in accordance with the process control strategy, the step of evaluating being performed by the statistical process control system.

14. The method as in claim 13, wherein the step of maintaining includes:
    receiving, through the user interface, a capability specification identifying a data collection capability of a semiconductor tool; and
    receiving, through the user interface, the data collection plan to identify which data the semiconductor tool will collect.

15. The method as in claim 13, wherein the step of receiving includes receiving the measurement data from a data broker.

16. The method as in claim 13, wherein the step of receiving includes receiving the measurement data in real-time.

17. The method as in claim 13, wherein the step of evaluating includes performing statistical process analysis on the measurement data.

18. The method as in claim 13, wherein the step of evaluating includes performing capability analysis on the measurement data.

19. A method comprising the steps of:
    obtaining semiconductor process measurement data at a data broker in real-time, wherein the data broker updates a data history based on the process measurement data; and
    performing capability-analysis of the semiconductor process measurement data in real time.

20. A method comprising the steps of:
    receiving measurement data at a statistical process control system, the measurement data associated with a semiconductor process;
    evaluating the measurement data at the statistical process control system in accordance with a process control strategy; and
    implementing, through the statistical process control system, control actions based the step of evaluating; wherein implementing includes placing a unit of semiconductor material in a hold status wherein a unit is selected from a group consisting of one of a batch, a lot and a wafer.

* * * * *